(12) United States Patent
Yasuda et al.

(10) Patent No.: US 11,431,313 B2
(45) Date of Patent: Aug. 30, 2022

(54) RESONANT ELEMENT, FILTER, AND DIPLEXER

(71) Applicant: Murata Manufacturing Co., Ltd., Nagaokakyo (JP)

(72) Inventors: Shoma Yasuda, Nagaokakyo (JP); Hiroto Motoyama, Nagaokakyo (JP); Masayuki Kikuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/239,937

(22) Filed: Apr. 26, 2021

(65) Prior Publication Data

US 2021/0242851 A1    Aug. 5, 2021

Related U.S. Application Data

(63) Continuation of application No. PCT/JP2019/036268, filed on Sep. 17, 2019.

(51) Int. Cl.
*H03H 7/01* (2006.01)
*H03H 7/46* (2006.01)
*H01F 27/29* (2006.01)
*H03H 1/00* (2006.01)

(52) U.S. Cl.
CPC ........... *H03H 7/0115* (2013.01); *H01F 27/29* (2013.01); *H03H 7/463* (2013.01); *H03H 2001/0085* (2013.01)

(58) Field of Classification Search
CPC ......... H03H 2001/0085; H03H 7/0115; H03H 7/463

USPC .................................................. 333/175, 185
See application file for complete search history.

(56) References Cited

U.S. PATENT DOCUMENTS

| | | | |
|---|---|---|---|
| 6,222,427 B1 | 4/2001 | Kato et al. | |
| 8,264,302 B2* | 9/2012 | Nosaka | H03H 7/09 333/175 |
| 2005/0192047 A1 | 9/2005 | Ishiwata et al. | |
| 2015/0094009 A1 | 4/2015 | Yosui et al. | |

(Continued)

FOREIGN PATENT DOCUMENTS

| | | |
|---|---|---|
| EP | 2 009 787 A1 | 12/2008 |
| JP | 06-232005 A | 8/1994 |
| JP | 09-35936 A | 2/1997 |

(Continued)

OTHER PUBLICATIONS

Official Communication issued in International Patent Application No. PCT/JP2019/036268, dated Dec. 3, 2019.

*Primary Examiner* — Rakesh B Patel
(74) *Attorney, Agent, or Firm* — Keating & Bennett, LLP

(57) ABSTRACT

A resonant element includes first, second, and third plane electrodes, a first via electrode defining a first inductor, a second inductor, and a third inductor. The first via electrode connects the first plane electrode and the second plane electrode, and each of the second inductor and the third inductor connects the first plane electrode and the third plane electrode. The third plane electrode defines a first capacitor together with the second plane electrode, the second inductor includes second via electrodes, and the third inductor includes third via electrodes. Each of the second via electrodes and the third via electrodes is a columnar conductor extending in the extending direction of the first via electrode.

17 Claims, 23 Drawing Sheets

(56) References Cited

U.S. PATENT DOCUMENTS

2020/0176851 A1   6/2020   Motoyama

FOREIGN PATENT DOCUMENTS

| JP | 2000-165171 A | 6/2000 |
| JP | 2004-328569 A | 11/2004 |
| JP | 2005-244583 A | 9/2005 |
| JP | 2008-017242 A | 1/2008 |
| JP | 2010-141859 A | 6/2010 |
| JP | 2016-015740 A | 1/2016 |
| JP | 2018-196082 A | 12/2018 |
| JP | 6649916 B2 | 2/2020 |
| WO | 2007/119356 A1 | 10/2007 |

* cited by examiner

RESONANT ELEMENT, FILTER, AND DIPLEXER

CROSS REFERENCE TO RELATED APPLICATIONS

This application claims the benefit of priority to Japanese Patent Application No. 2018-219198 filed on Nov. 22, 2018 and is a Continuation Application of PCT Application No. PCT/JP2019/036268 filed on Sep. 17, 2019. The entire contents of each application are hereby incorporated herein by reference.

BACKGROUND OF THE INVENTION

1. Field of the Invention

The present invention relates to a resonant element, a filter, and a diplexer.

2. Description of the Related Art

Conventionally, a resonant element in which a plurality of electrodes are formed inside a dielectric is known.

For example, Japanese Patent Application Laid-Open No. 2000-165171 discloses an LC resonator component in which two ground conductors and via holes forming an inductor and a capacitor electrode are formed inside a dielectric. With this configuration, it is possible to provide a small and inexpensive LC resonator component having good Q characteristics.

In the LC resonator component disclosed in Japanese Patent Application Laid-Open No. 2000-165171, the two ground conductors are formed in a wall shape having a width similar to that of the via hole. Generally, the strength of an electrode formed of a conductive paste is lower than the strength of a dielectric. Therefore, when a wall-shaped electrode having a width similar to that of the via electrode is formed inside the dielectric as in the LC resonator component disclosed in Japanese Patent Application Laid-Open No. 2000-165171, the percentage of the dielectric in the LC resonator component may decrease and the strength of the resonant element may be lowered.

SUMMARY OF THE INVENTION

Preferred embodiments of the present invention provide resonant elements each with improved strength.

In a resonant element according to a preferred embodiment of the present invention, a plurality of electrodes are provided inside a dielectric. The resonant element includes at least one first plane electrode, a second plane electrode, a third plane electrode, a first via electrode defining a first inductor, a second inductor, and a third inductor. The second plane electrode faces at least one first plane electrode in the normal direction of the at least one first plane electrode. The first via electrode connects the at least one first plane electrode and the second plane electrode. The third plane electrode defines a first capacitor together with the second plane electrode. The second inductor connects the at least one first plane electrode and the third plane electrode. The third inductor connects the at least one first plane electrode and the third plane electrode. The second inductor includes at least one second via electrode connecting the at least one first plane electrode and the third plane electrode. The third inductor includes at least one third via electrode connecting the at least one first plane electrode and the third plane electrode. Each of the one or more second via electrodes and the one or more third via electrodes is a columnar conductor extending in the extending direction of the first via electrode.

With resonant elements according to preferred embodiments of the present invention, since each of the second via electrode and the third via electrode is a columnar conductor extending in the extending direction of the first via electrode, the strength of the resonant elements is able to be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
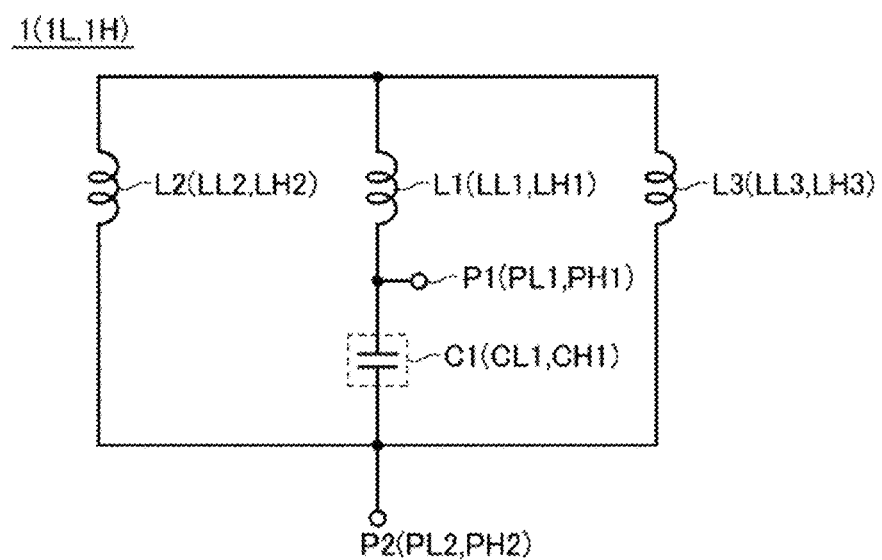
FIG. 1 is an equivalent circuit diagram of a resonant element according to a first preferred embodiment of the present invention.

Hereinafter, preferred embodiments of the present invention will be described in detail with reference to the drawings. The same or corresponding portions in the drawings are denoted by the same reference numerals and the description is not repeated.

First Preferred Embodiment

FIG. 1 is an equivalent circuit diagram of a resonant element 1 according to a first preferred embodiment of the present invention. The equivalent circuit shown in FIG. 1 is the same as or similar to an equivalent circuit of a resonant element 1L described in second and third preferred embodiments and a resonant element 1H described in the second preferred embodiment. That is, inductors L1 to L3, a capacitor C1, and input-output portions P1 and P2 in FIG. 1 correspond to inductors LL1 to LL3, a capacitor CL1, and input-output portions PL1 and PL2 of the resonant element 1L, respectively, and also correspond to inductors LH1 to LH3, a capacitor CH1, and input-output portions PH1 and PH2 of the resonant element 1H, respectively.

As shown in FIG. 1, the resonant element 1 includes the inductor L1 (first inductor), the inductor L2 (second inductor), the inductor L3 (third inductor), the capacitor C1 (first capacitor), the input-output portion P1 (first input-output portion), and the input-output portion P2 (second input-output portion). One end of the inductor L1 is connected to the input-output portion P1. The inductors L2 and L3 are connected in parallel between the other end of the inductor L1 and the input-output portion P2. The capacitor C1 is connected between the input-output portions P1 and P2. The resonant element 1 defines an LC parallel resonator.

Figure 2:
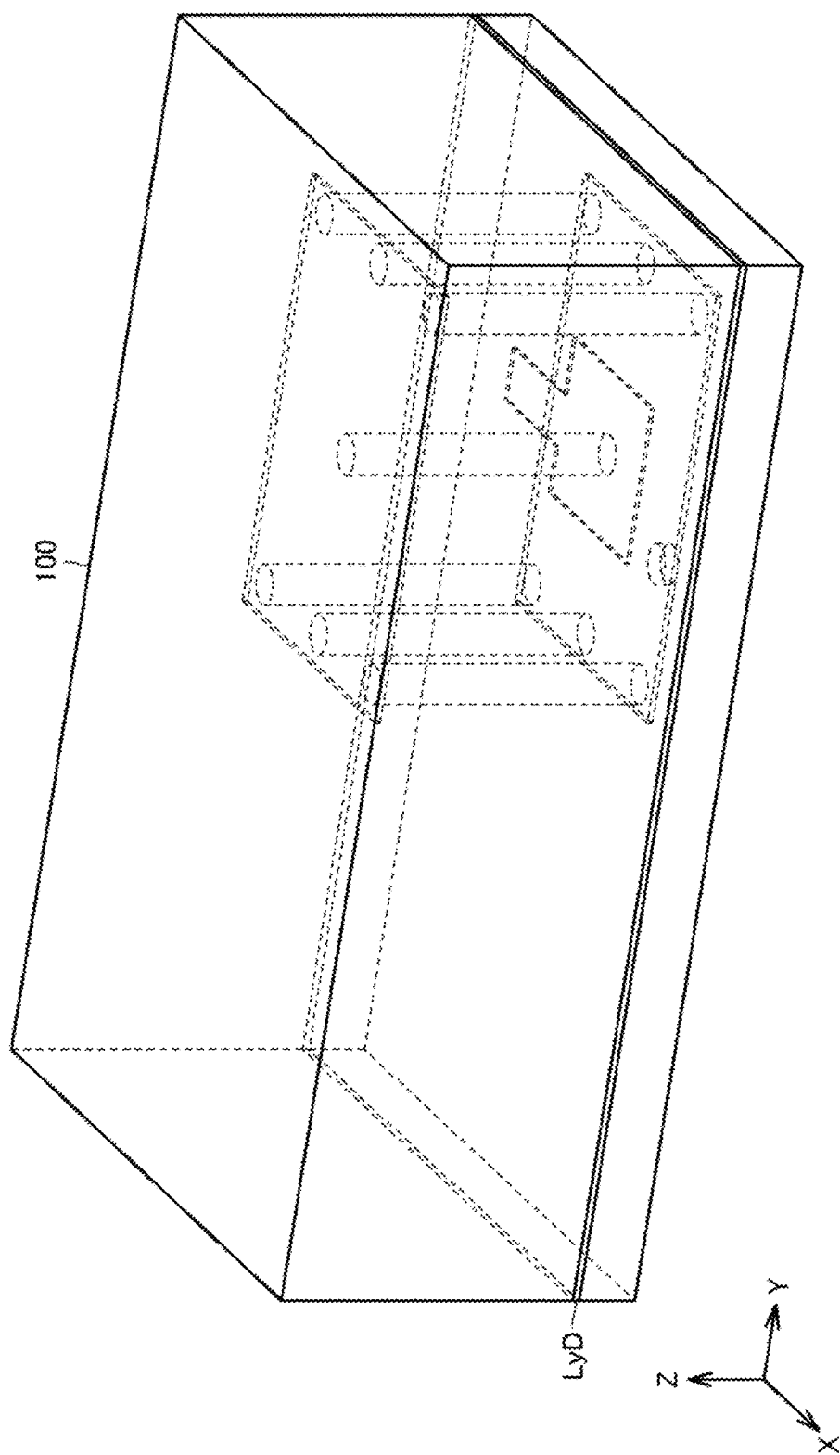
FIG. 2 is an external perspective view of the resonant element of FIG. 1.

FIG. 2 is an external perspective view of the resonant element 1 of FIG. 1. The X-axis, Y-axis, and Z-axis shown in FIG. 2 are orthogonal or substantially orthogonal to each other. The X-axis, Y-axis, and Z-axis are similarly orthogonal or substantially orthogonal to each other as shown in FIGS. 3 to 7, 9, 11 to 14, and 19 to 23. As shown in FIG. 2, in the resonant element 1, a plurality of electrodes defining the equivalent circuit shown in FIG. 1 are provided inside a laminate 100 (dielectric) provided by laminating a plurality of dielectric layers in the Z-axis direction. In the resonant element 1, a dielectric layer LyD having a dielectric constant different from that of the other dielectric layers is provided between two plane electrodes defining the capacitor C1. The capacitance of capacitor C1 is adjusted by the dielectric layer LyD.

Figure 3:
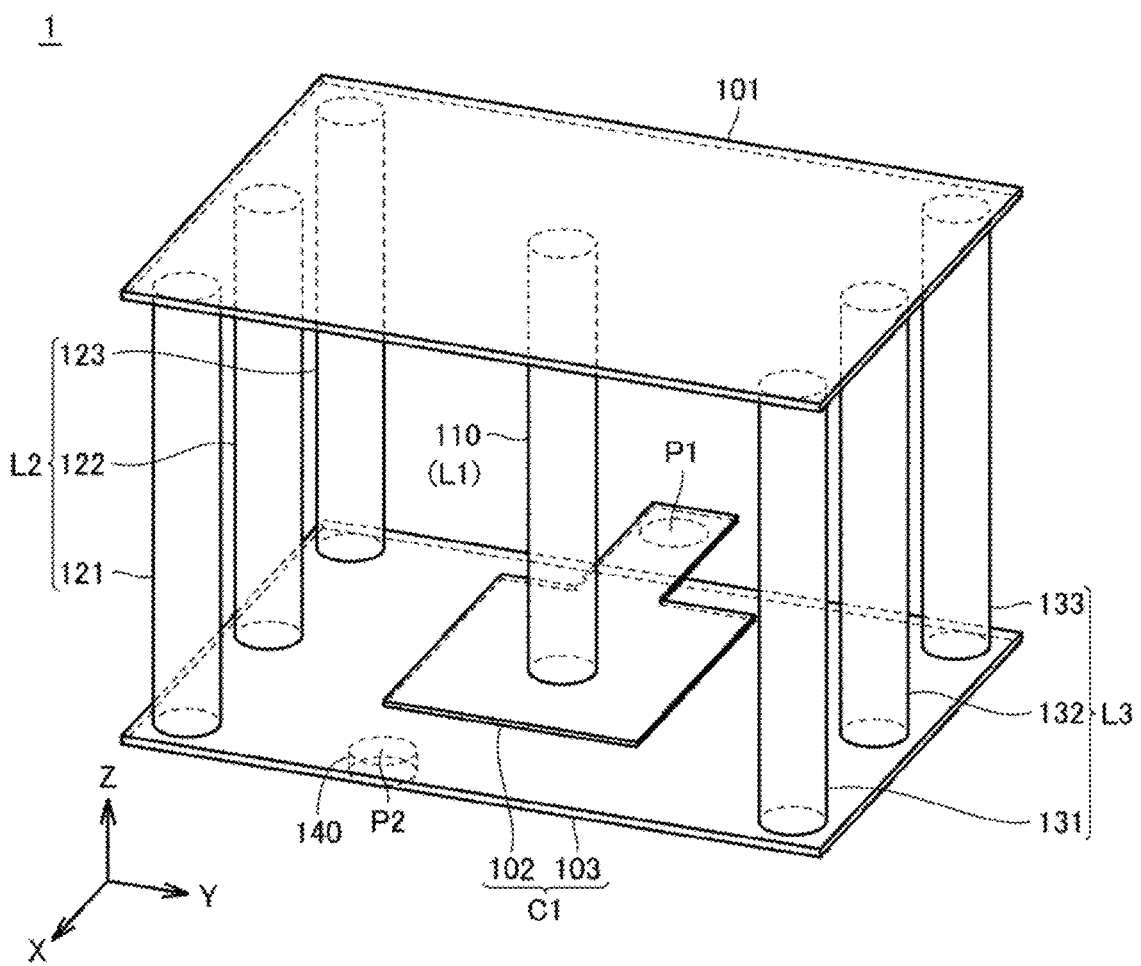
FIG. 3 is a perspective view of a plurality of electrodes provided inside a laminate of FIG. 2.
Figure 4:
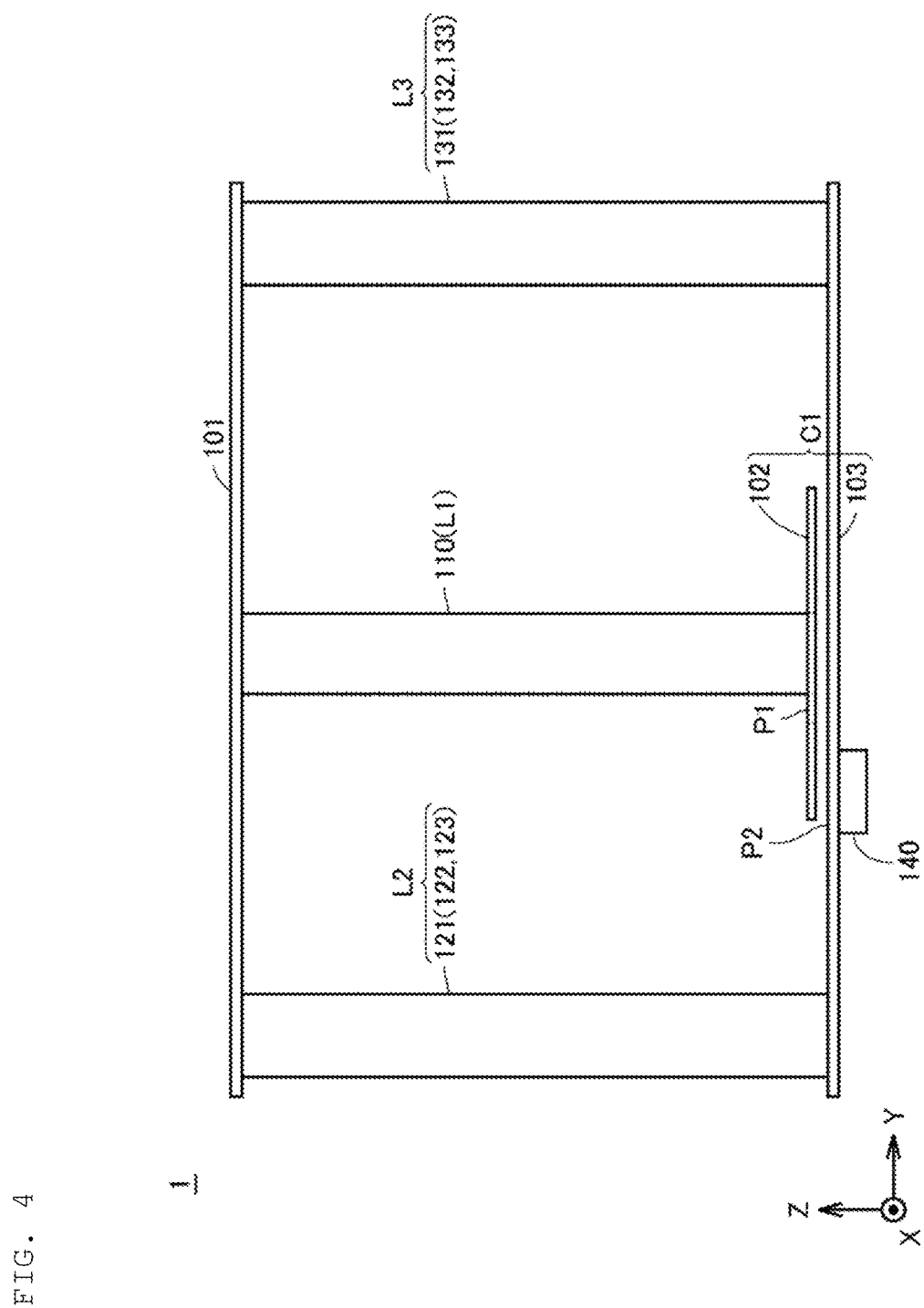
FIG. 4 is a plan view of the plurality of electrodes shown in FIG. 3 as viewed from the X-axis direction.
Figure 5:
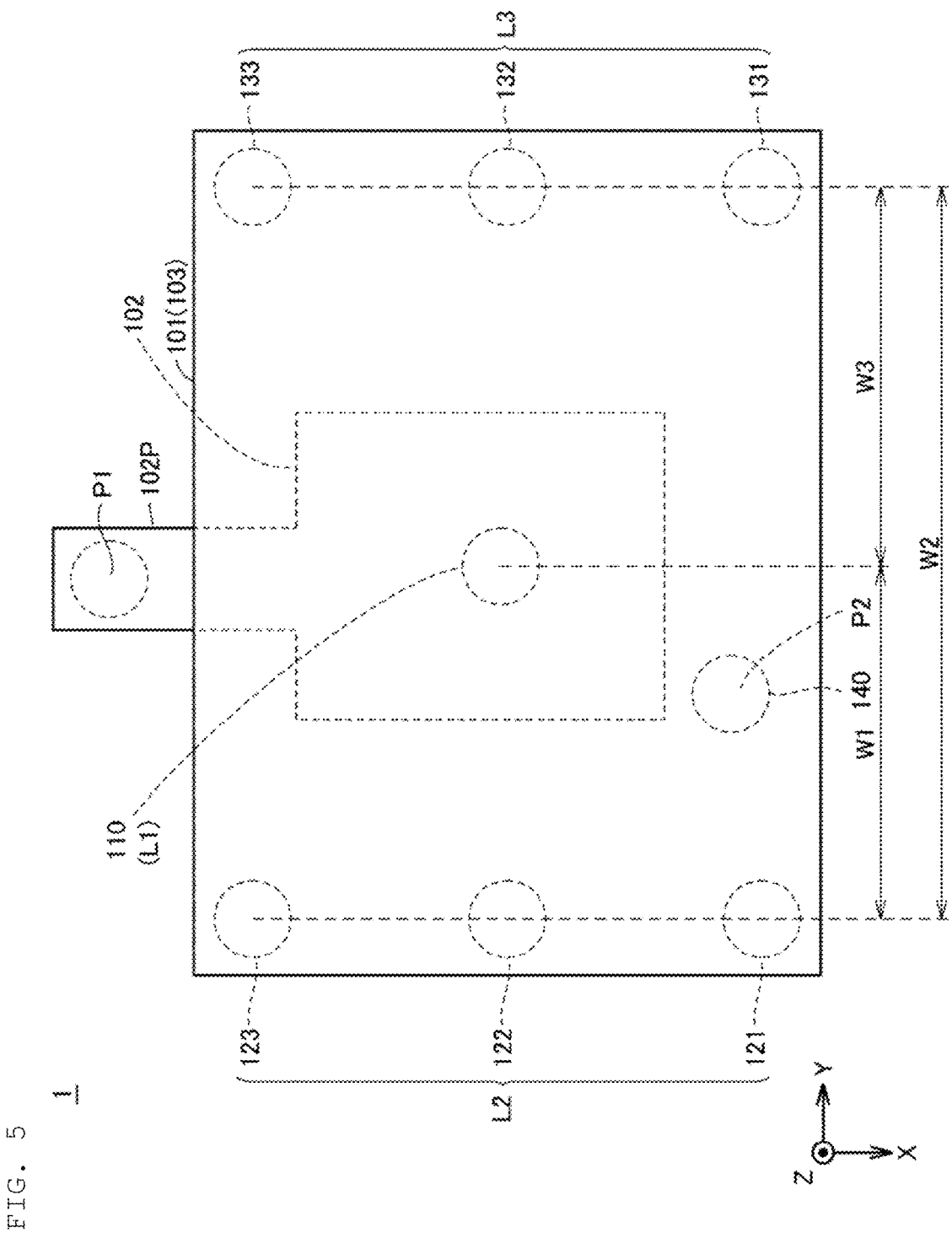
FIG. 5 is a plan view of the plurality of electrodes shown in FIG. 3 as viewed from the Z-axis direction.

FIG. 3 is a perspective view of a plurality of electrodes provided inside the laminate 100 of FIG. 2. FIG. 4 is a plan view of the plurality of electrodes shown in FIG. 3 as viewed from the X-axis direction. FIG. 5 is a plan view of the plurality of electrodes shown in FIG. 3 as viewed from the Z-axis direction. In FIGS. 3 to 5, the laminate 100 of FIG. 2 is not shown in order to make it easier to see the connection relationship of the plurality of electrodes.

As shown in FIGS. 3 to 5, the resonant element 1 includes a plane electrode 101 (first plane electrode), a plane electrode 102 (second plane electrode), a plane electrode 103 (third plane electrode), a via electrode 110 (first via electrode), a via electrode 121 (second via electrode), a via electrode 122 (second via electrode), a via electrode 123 (second via electrode), a via electrode 131 (third via electrode), a via electrode 132 (third via electrode), a via electrode 133 (third via electrode), and a via electrode 140. The normal direction of each of the plane electrodes 101 to 103 is the Z-axis direction. The plane electrodes 101 and 103 have a rectangular or substantially rectangular shape. The via electrodes 110, 121 to 123, 131 to 133, and 140 are columnar conductors extending in the Z-axis direction.

The plane electrode 102 faces the plane electrode 101 in the normal direction (Z-axis direction) of the plane electrode 101. The via electrode 110 connects the plane electrodes 101 and 102. The via electrode 110 defines the inductor L1.

The plane electrode 103 faces the plane electrode 102 in the Z-axis direction, and defines the capacitor C1 with the plane electrode 102. The dielectric layer LyD in FIG. 2 is provided between the plane electrodes 102 and 103.

With reference to FIGS. 3 to 5, each of the via electrodes 121 to 123 connects the plane electrodes 101 and 103. The via electrodes 121 to 123 define the inductor L2. Each of the via electrodes 131 to 133 connects the plane electrodes 101 and 103. The via electrodes 131 to 133 define the inductor L3.

In the resonant element 1, the inductors L2 and L3 include via electrodes extending in the Z-axis direction. According to the resonant element 1, the proportion of the dielectric in the resonant element 1 is able to be significantly increased as compared with the case where each of the inductors L2 and L3 includes a wall-shaped electrode having a width the same as or similar to that of the via electrode.

Generally, the strength of an electrode including a conductive paste is lower than the strength of a dielectric. Therefore, the resonant element 1 has higher strength than the case where each of the inductors L2 and L3 includes a wall-shaped electrode having a width similar to that of the via electrode.

With reference to FIG. 5, the via electrodes 121 to 123 are provided along one side of the plane electrode 101 parallel or substantially parallel to the X-axis direction (first direction). The via electrodes 131 to 133 are provided along the other side of the plane electrode 101 parallel or substantially parallel to the X-axis direction, separated from the via electrodes 121 to 123 in the Y-axis direction (second direction). The plane electrode 102 is located between the via electrodes 121 to 123 and the via electrodes 131 to 133.

The plane electrode 102 includes a protrusion 102P on which the input-output portion P1 is provided. When the plane electrode 101 is viewed in a plan view from the Z-axis direction, the portion of the protrusion 102P on which the input-output portion P1 is provided does not overlap with the plane electrodes 102 and 103.

With reference to FIG. 4, the via electrode 140 extends from the plane electrode 103 toward a side opposite to the side on which the plane electrode 102 is provided. The input-output portion P2 is provided at a connecting portion between the plane electrode 102 and the via electrode 140.

In the resonant element 1, the inductors L1 to L3 and the capacitor C1 are included in a region between the plane electrodes 101 and 103. On the other hand, the input-output portions P1 and P2 are not included in such region. To connect with other circuit elements, unnecessary contact with the inductors L1 to L3 and the capacitor C1 by the other circuit elements is able to be avoided, and the resonant element is able to be easily connected to the other circuit elements.

With reference to FIG. 5, a distance W1 between the via electrode 110 (inductor L1) and the via electrodes 121 to 123 (inductor L2) is smaller than a distance W2 between the inductor L2 and the via electrodes 131 to 133 (inductor L3). A distance W3 between the inductor L1 and the inductor L3 is smaller than the distance W2. In the resonant element 1, the current guided from the inductor L1 to the plane electrode 101 is dispersed in the inductors L2 and L3. As a result, the resistance component due to the inductors L1 to L3 is reduced, and the Q value of the resonant element 1 is able to be improved. Further, each of the inductors L2 and L3 includes a plurality of via electrodes connected in parallel between the plane electrodes 101 and 103. Since the resistance components of the inductors L2 and L3 are reduced, the Q value of the resonant element 1 is able to be further improved.

First Modification of First Preferred Embodiment

In the first preferred embodiment, the case where each of the inductors L2 and L3 includes a plurality of via electrodes has been described. As in a resonant element 1A according to a first modification of the first preferred embodiment shown in FIG. 6, the inductor L2 may include one via electrode 120 (second via electrode) and the inductor L3 may include one via electrode 130 (third via electrode).

Second Modification of First Preferred Embodiment

In the first preferred embodiment and the first modification, the resonant element including one first plane electrode has been described. The number of first plane electrodes included in the resonant element according to the first preferred embodiment may be two or more. In a second modification of the first preferred embodiment, a resonant element including two first plane electrodes will be described.

Figure 6:
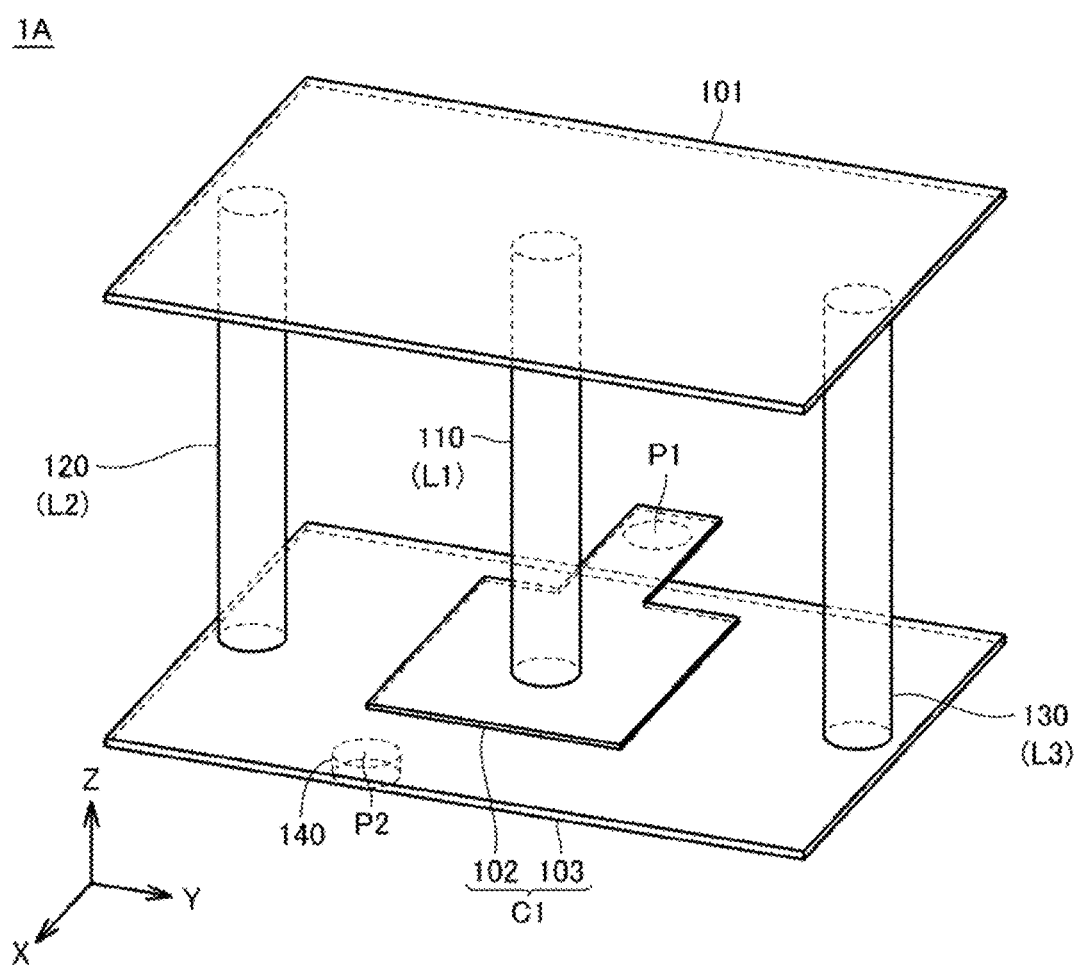
FIG. 6 is a perspective view of a plurality of electrodes provided inside a dielectric of a resonant element according to a first modification of the first preferred embodiment of the present invention.
Figure 7:
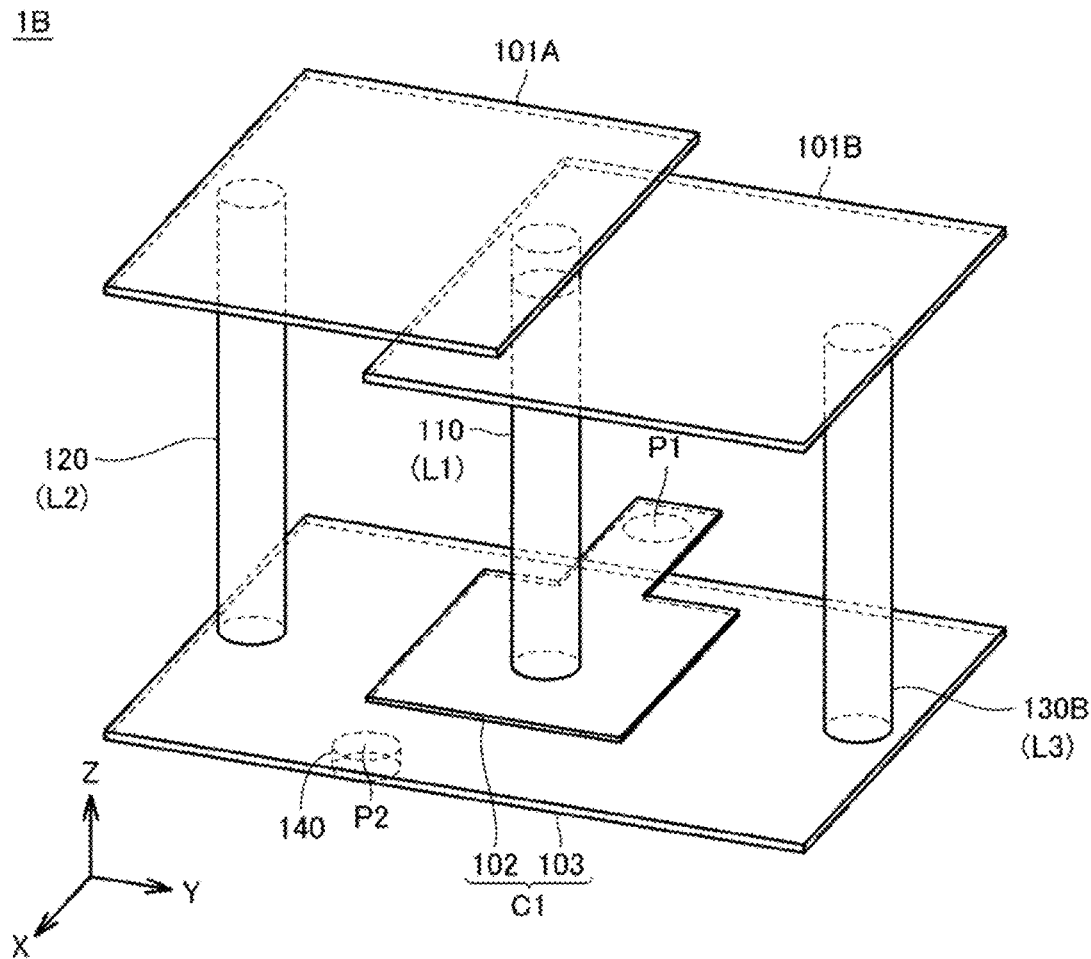
FIG. 7 is a perspective view of a plurality of electrodes provided inside a dielectric of a resonant element according to a second modification of the first preferred embodiment of the present invention.

FIG. 7 is a perspective view of a plurality of electrodes provided inside a dielectric of a resonant element 1B according to the second modification of the first preferred embodiment. In the resonant element 1B, the plane electrode 101 of the resonant element 1A shown in FIG. 6 is replaced with a plane electrode 101A (first plane electrode) and a plane electrode 101B (first plane electrode), and the via electrode 130 of the resonant element 1A is replaced with a via electrode 130B (third via electrode). Features other than those described above are the same as or similar to the features of the first preferred embodiment. Therefore, the explanation thereof is not repeated.

As shown in FIG. 7, the plane electrodes 101A and 101B are connected to each other by the via electrode 110. Note that the plane electrodes 101A and 101B may be connected to each other, and may be connected to each other by via electrodes other than the via electrodes 110, 120 and 130B, for example. The via electrode 120 connects the plane electrodes 101A and 103. The via electrode 130B connects the plane electrodes 101B and 103.

Third Modification of First Preferred Embodiment

In the first preferred embodiment and the first and second modifications, the case where the second input-output portion is provided on the third plane electrode has been described. In a third modification of the first preferred embodiment, the case where the second input-output portion is provided on the first plane electrode will be described.

Figure 8:
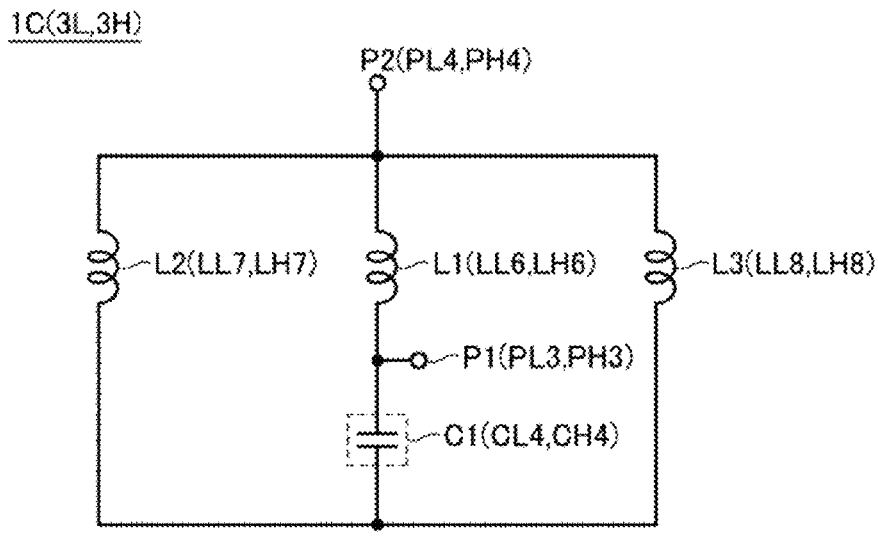
FIG. 8 is an equivalent circuit diagram of a resonant element according to a third modification of the first preferred embodiment of the present invention.

FIG. 8 is an equivalent circuit diagram of a resonant element 1C according to the third modification of the first preferred embodiment. According to the features of the equivalent circuit of the resonant element 1C, the input-output portion P2 of the equivalent circuit of the resonant element 1 shown in FIG. 1 is connected to the connection points of the inductors L1 to L3. Features other than those described above are the same as or similar to the features of the first preferred embodiment. Therefore, the explanation thereof is not repeated. The equivalent circuit shown in FIG. 8 is the same as or similar to the equivalent circuit of resonant elements 3L and 3H described in a third preferred embodiment. That is, the inductors L1 to L3, the capacitors C1, and the input-output portions P1 and P2 in FIG. 8 correspond to inductors LL6 to LL8, a capacitor CL4, and input-output portions PL3 and PL4 of the resonant element 3L, respectively, and also correspond to inductors LH6 to LH8, a capacitor CH4, and input-output portions PH3 and PH4 of the resonant element 3H, respectively.

Figure 9:
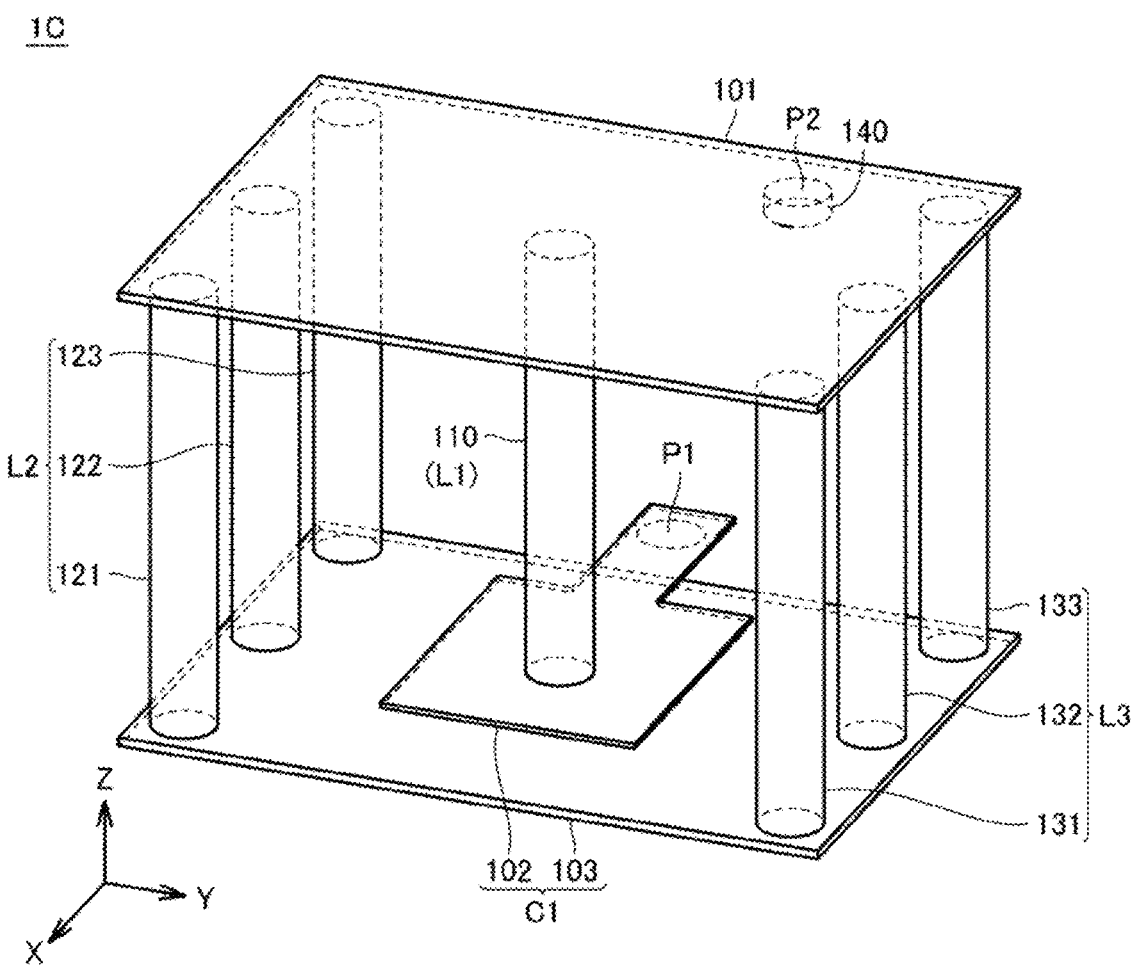
FIG. 9 is a perspective view of a plurality of electrodes provided inside a dielectric of the resonant element according to the third modification of the first preferred embodiment of the present invention.

FIG. 9 is a perspective view of a plurality of electrodes provided inside a dielectric of the resonant element 1C according to the third modification of the first preferred embodiment. In the resonant element 1C, the via electrode 140 of the resonant element 1 shown in FIG. 3 is connected to the plane electrode 101. Features other than those described above are the same as or similar to the features of the first preferred embodiment. Therefore, the explanation thereof is not repeated. The input-output portion P2 is provided at a connecting portion between the plane electrode 101 and the via electrode 140.

As described above, according to the resonant elements of the first preferred embodiment and the first to third modifications, the strength of the resonant elements is able to be improved. Further, according to the resonant elements, connection with other circuit elements is able to be easily made. Further, according to the resonant elements, the Q value is able to be improved.

Second Preferred Embodiment

In a second preferred embodiment of the present invention, a diplexer including the resonant element described in the first preferred embodiment will be described.

Figure 10:
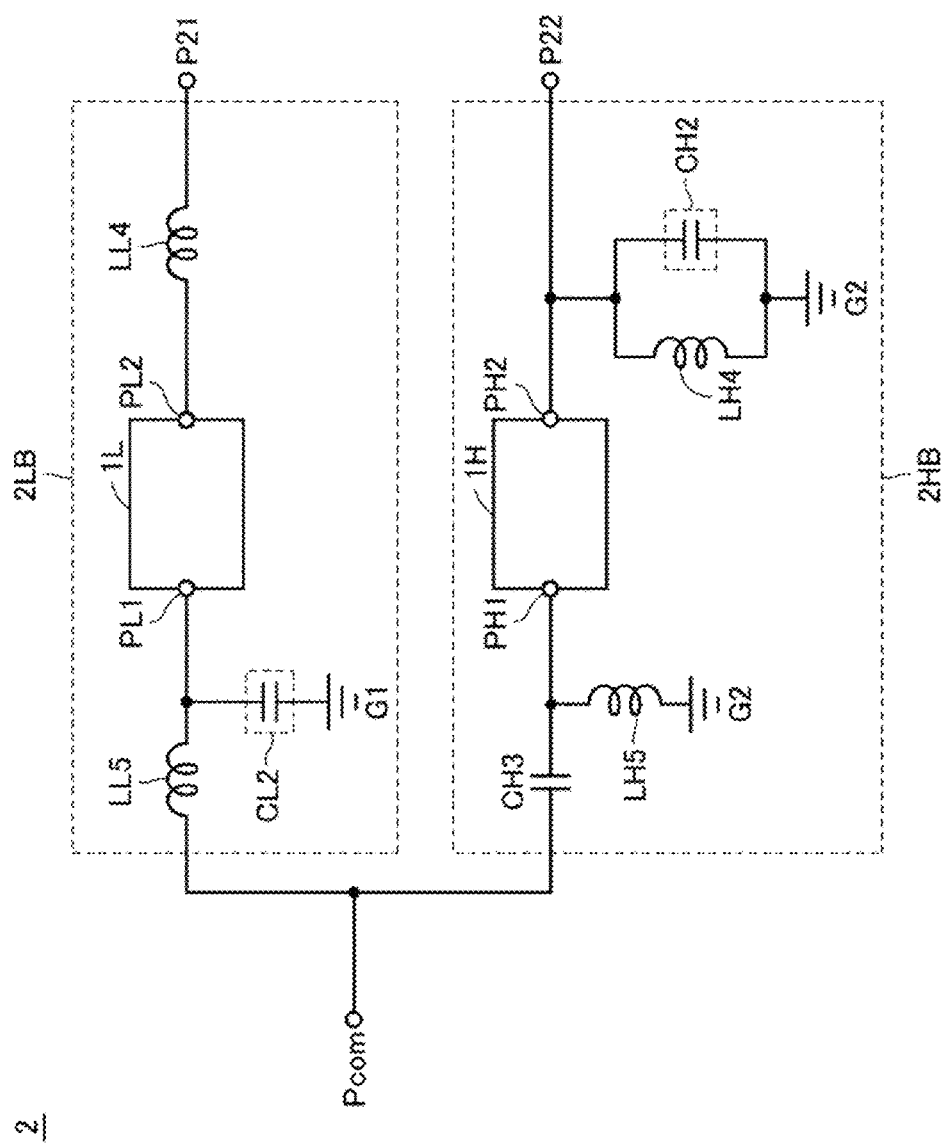
FIG. 10 is an equivalent circuit diagram of a diplexer according to a second preferred embodiment of the present invention.

FIG. 10 is an equivalent circuit diagram of a diplexer 2 according to the second preferred embodiment. As shown in FIG. 10, the diplexer 2 includes a common terminal Pcom, an input-output terminal P21 (first input-output terminal), an input-output terminal P22 (second input-output terminal), a low-pass filter 2LB, and a high-pass filter 2HB.

The low-pass filter 2LB is connected between the common terminal Pcom and the input-output terminal P21. The low-pass filter 2LB includes an inductor LL5, a capacitor CL2, a resonant element 1L, and an inductor LL4 (fourth inductor).

The inductor LL5 is connected between the common terminal Pcom and the input-output portion PL1. The capacitor CL2 is connected between a ground terminal G1 (ground point) and the connection point of the inductor LL5 and the input-output portion PL1. The inductor LL4 is connected between the input-output portion PL2 and the input-output terminal P21.

The high-pass filter 2HB is connected between the common terminal Pcom and the input-output terminal P22. The high-pass filter 2HB includes a capacitor CH3, an inductor LH5, a resonant element 1H, an inductor LH4 (fourth inductor), and a capacitor CH2 (second capacitor).

The capacitor CH3 is connected between the common terminal Pcom and the input-output portion PH1. The inductor LH5 is connected between a ground terminal G2 (ground point) and the connection point of the capacitor CH3 and the input-output portion PH1. The input-output portion PH2 is connected to the input-output terminal P22. The inductor LH4 and the capacitor CH2 are connected in parallel between the ground terminal G2 and the connection point of the input-output portion PH2 and the input-output terminal P22. The LC parallel resonator including the inductor LH4 and the capacitor CH2 reduces an insertion loss in the pass band of the high-pass filter 2HB.

Figure 11:
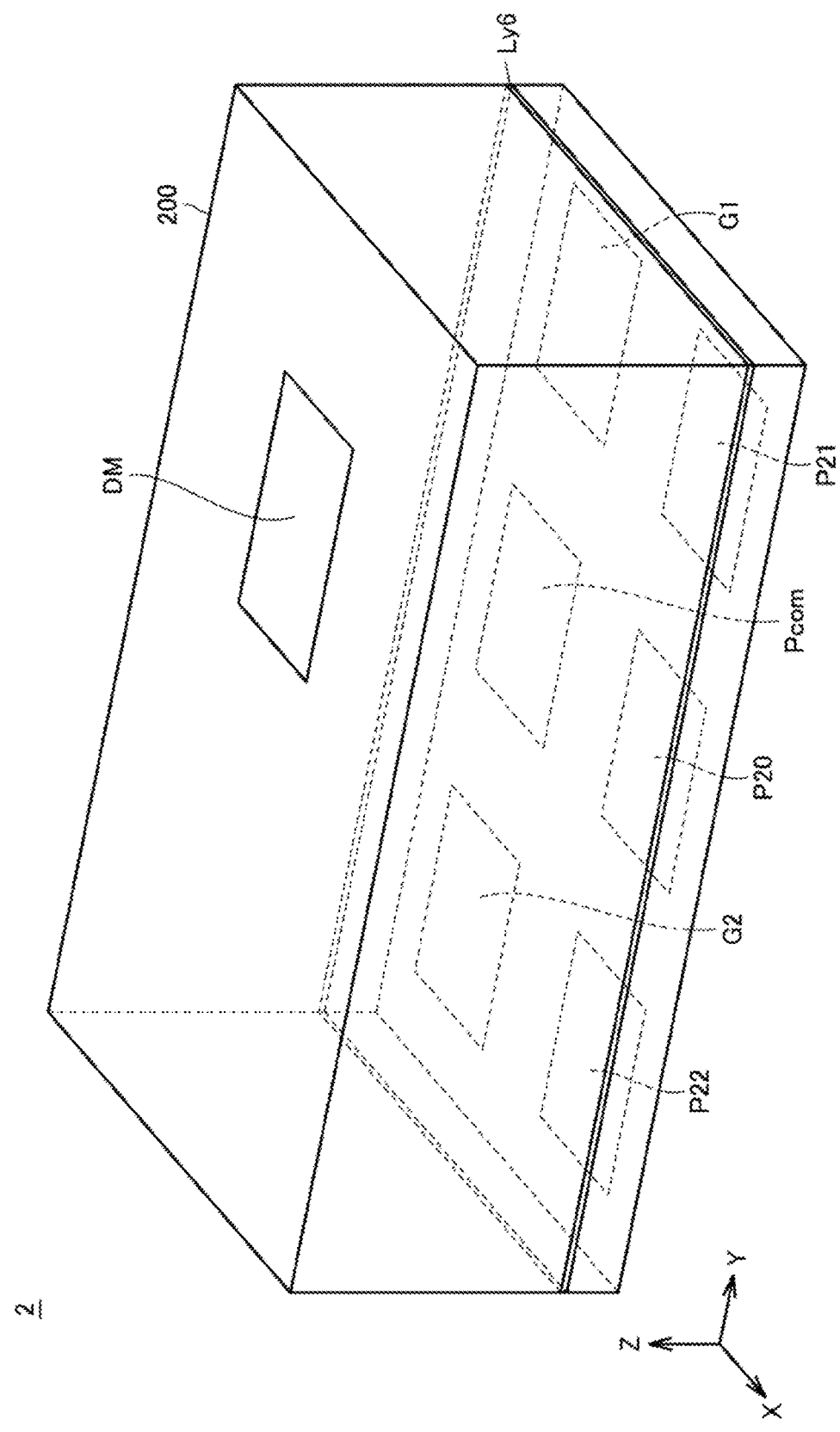
FIG. 11 is an external perspective view of the diplexer of FIG. 10.
Figure 12:
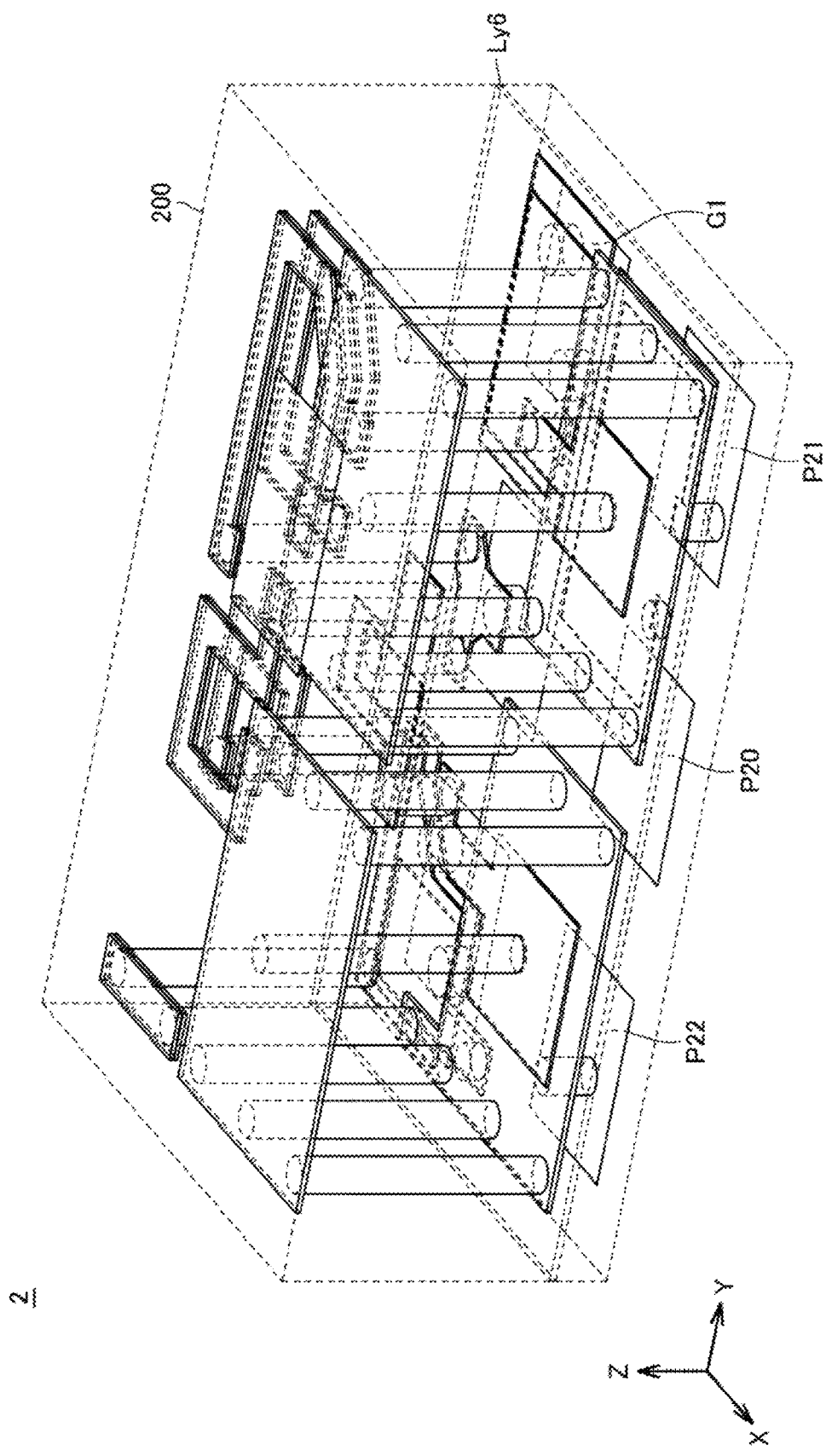
FIG. 12 is a perspective view of a plurality of electrodes provided inside a laminate 200 of FIG. 11.

FIG. 11 is an external perspective view of the diplexer 2 of FIG. 10. FIG. 12 is a perspective view of a plurality of electrodes provided inside a laminate 200 of FIG. 11. As shown in FIGS. 11 and 12, in the diplexer 2, a plurality of electrodes defining the equivalent circuit shown in FIG. 10 are provided inside the laminate 200 (dielectric) provided by laminating a plurality of dielectric layers in the Z-axis direction.

With reference to FIG. 11, a direction identification mark DM is provided on the upper surface of the diplexer 2. The common terminal Pcom, the input-output terminals P21 and P22, the terminal P20, and the ground terminals G1 and G2 are provided on the bottom surface of the diplexer 2. Each of the common terminal Pcom, the input-output terminals P21 and P22, the terminal P20, and the ground terminals G1 and G2 is, for example, a land grid array (LGA) terminal in which plane electrodes are regularly arranged on the bottom surface. The bottom surface of the diplexer 2 is connected to a circuit board not shown.

Figure 13:
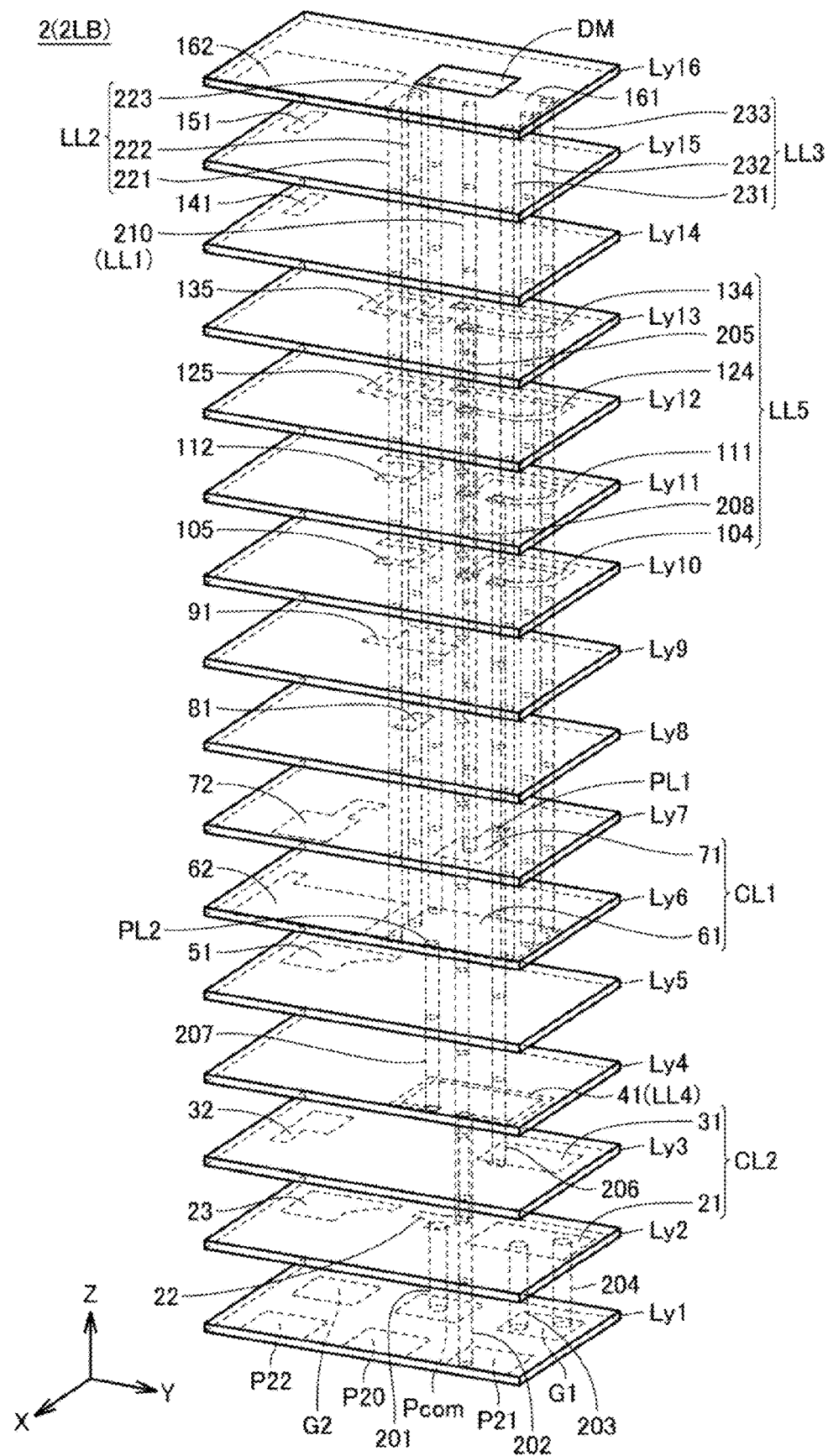
FIG. 13 is an exploded perspective view showing an example of a laminated structure of a low-pass filter of the diplexer of FIGS. 11 and 12.
Figure 14:
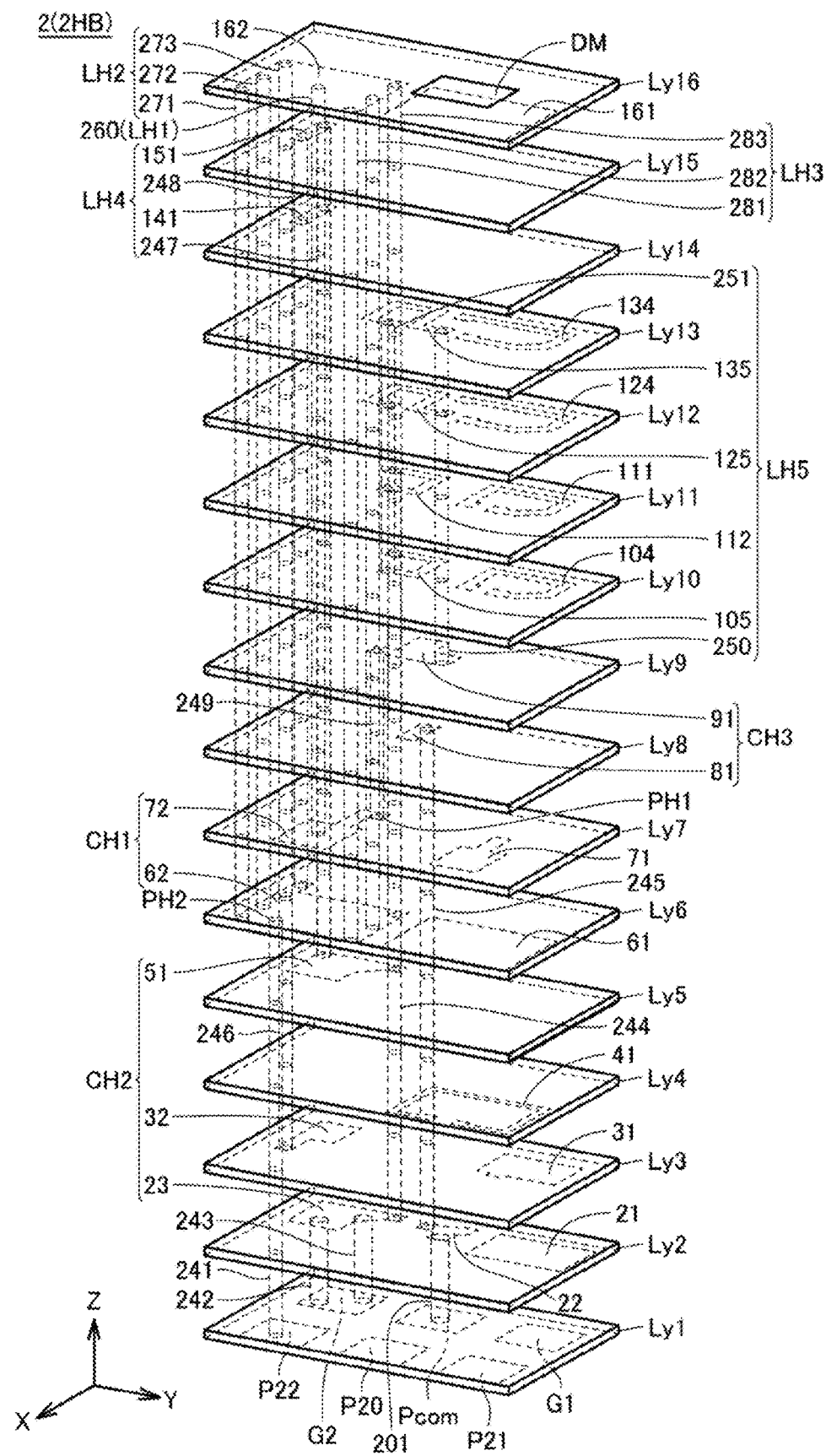
FIG. 14 is an exploded perspective view showing an example of a laminated structure of a high-pass filter of the diplexer of FIGS. 11 and 12.

FIGS. 13 and 14 are exploded perspective views showing an example of a laminated structure of the diplexer 2 of FIGS. 11 and 12. In order to make it easier to see the connection relationship of the respective electrodes in the laminated structure, the connection relationship of a plurality of electrodes defining the low-pass filter 2LB of FIG. 10 will be described with respect to FIG. 13, and a plurality of electrodes defining the high-pass filter 2HB of FIG. 10 will be described with respect to FIG. 14.

As shown in FIG. 13, in the diplexer 2, a plurality of dielectric layers Ly1 to Ly16 are laminated in the Z-axis direction. The common terminal Pcom, the input-output terminals P21 and P22, the terminal P20, and the ground terminals G1 and G2 are provided on the dielectric layer Ly1.

Plane electrodes 21 to 23 are provided on the dielectric layer Ly2. The plane electrode 21 is connected to the ground terminal G1 by each of via electrodes 203 and 204. The plane electrode 22 is connected to the common terminal Pcom by a via electrode 201.

Plane electrodes 31 and 32 are provided on the dielectric layer Ly3. The plane electrodes 21 and 31 define the capacitor CL2. A line electrode 41 winds around the dielectric layer Ly4. One end of the line electrode 41 is connected to the input-output terminal P21 by a via electrode 202. The line electrode 41 defines the inductor LL4. A plane electrode 51 is provided on the dielectric layer Ly5.

A plane electrode 61 (third plane electrode) and a plane electrode 62 (third plane electrode) are provided on the dielectric layer Ly6. The plane electrode 61 is connected to the other end of the line electrode 41 by a via electrode 207. The input-output portion PL2 is provided at the connection portion between the plane electrode 61 and the via electrode 207.

A plane electrode 71 (second plane electrode) and a plane electrode 72 (second plane electrode) are provided on the dielectric layer Ly7. The plane electrode 71 is connected to the plane electrode 31 by a via electrode 206. The input-output portion PL1 is provided on the protrusion of the plane electrode 71, and the via electrode 206 is connected to the input-output portion PL1. The plane electrodes 61 and 71 define the capacitor CL1. A plane electrode 81 is provided on the dielectric layer Ly8. A plane electrode 91 is provided on the dielectric layer Ly9.

On the dielectric layer Ly10, each of the line electrodes 104 and 105 is wound. One end of the line electrode 104 is connected to the plane electrode 31 by the via electrode 206. On the dielectric layer Ly11, each of the line electrodes 111 and 112 is wound. One end of the line electrode 111 is connected to one end of the line electrode 104 by the via electrode 206. The other end of the line electrode 111 is connected to the other end of the line electrode 104 by a via electrode 208.

On the dielectric layer Ly12, each of line electrodes 124 and 125 is wound. One end of a line electrode 124 is connected to the other end of the line electrode 111 by the via electrode 208. The other end of the line electrode 124 is connected to the plane electrode 22 by a via electrode 205.

According to the structure of the dielectric layer Ly13, each of line electrodes 134 and 135 is wound. One end of the line electrode 134 is connected to one end of the line electrode 124 by the via electrode 208. The other end of the line electrode 134 is connected to the other end of the line electrode 124 by the via electrode 205. The line electrodes 104, 111, 124, and 134 and the via electrodes 205 and 208 define the inductor LL5. A line electrode 141 is provided on the dielectric layer Ly14. A line electrode 151 is provided on the dielectric layer Ly15.

A plane electrode 161 (first plane electrode) and a plane electrode 162 (first plane electrode) are provided on the dielectric layer Ly16. The plane electrode 161 is connected to the plane electrode 71 by a via electrode 210 (first via electrode). The via electrode 210 defines an inductor LL1.

The plane electrode 161 is connected to the plane electrode 61 by each of a via electrode 221 (second via electrode), a via electrode 222 (second via electrode), and a via electrode 223 (second via electrode). The via electrodes 221 to 223 define an inductor LL2. The plane electrode 161 is connected to the plane electrode 61 by each of a via electrode 231 (third via electrode), a via electrode 232 (third via electrode), and to via electrode 233 (third via electrode). The via electrodes 231 to 233 define an inductor LL3.

Next, with reference to FIG. 14, a plane electrode 23 provided on the dielectric layer Ly2 is connected to the ground terminal G2 by each of via electrodes 242 and 243. A plane electrode 51 provided on the dielectric layer Ly5 is connected to the plane electrode 23 by a via electrode 244.

A plane electrode 62 provided on the dielectric layer Ly6 is connected to the input-output terminal P22 by a via electrode 241. The input-output portion PH2 is provided at the connection portion between the plane electrode 62 and the via electrode 241. The plane electrode 62 is connected to the plane electrode 32 by a via electrode 246. The plane electrodes 23, 32, and 51 define the capacitor CH2.

A plane electrode 81 provided on the dielectric layer Ly8 is connected to a plane electrode 22 by a via electrode 245. A plane electrode 91 provided on the dielectric layer Ly9 is connected to a plane electrode 72 by a via electrode 249. The input-output portion PH1 is provided on the protrusion of the plane electrode 72, and the via electrode 249 is connected to the input-output portion PH1. The plane electrodes 81 and 91 define the capacitor CH3.

One end of a line electrode 105 provided on the dielectric layer Ly10 is connected to the plane electrode 51 by a via electrode 244. One end of a line electrode 112 provided on the dielectric layer Ly11 is connected to one end of the line electrode 105 by the via electrode 244. The other end of the line electrode 112 is connected to the other end of the line electrode 105 by a via electrode 251.

One end of a line electrode 125 provided on the dielectric layer Ly12 is connected to a plane electrode 91 by a via electrode 250. The other end of the line electrode 125 is connected to the other end of the line electrode 112 by the via electrode 251. One end of a line electrode 135 provided on the dielectric layer Ly13 is connected to one end of the line electrode 125 by the via electrode 250. The other end of the line electrode 135 is connected to the other end of the line electrode 125 by the via electrode 251. The line electrodes 105, 112, 125, and 135 and via electrodes 250 and 251 define the inductor LH5.

One end of a line electrode 141 provided on the dielectric layer Ly14 is connected to the plane electrode 62 by a via electrode 248. The other end of the line electrode 141 is connected to the plane electrode 51 by a via electrode 247. One end of a line electrode 151 provided on the dielectric layer Ly15 is connected to one end of the line electrode 141 by the via electrode 248. The other end of the line electrode 151 is connected to the other end of the line electrode 141 by the via electrode 247. The line electrodes 141 and 151 and the via electrodes 247 and 248 define the inductor LH4.

A plane electrode 162 provided on the dielectric layer Ly16 is connected to a plane electrode 72 by a via electrode 260 (first via electrode). The via electrode 260 defines the inductor LH1. The plane electrode 162 is connected to the plane electrode 62 by each of a via electrode 271 (second via electrode), a via electrode 272 (second via electrode), and a via electrode 273 (second via electrode). The via electrodes 271 to 273 define the inductor LH2. The plane electrode 162 is connected to the plane electrode 62 by each of a via electrode 281 (third via electrode), a via electrode 282 (third via electrode), and a via electrode 283 (third via electrode). The via electrodes 281 to 283 define the inductor LH3. The plane electrodes 62 and 72 define the capacitor CH1.

Figure 15A:
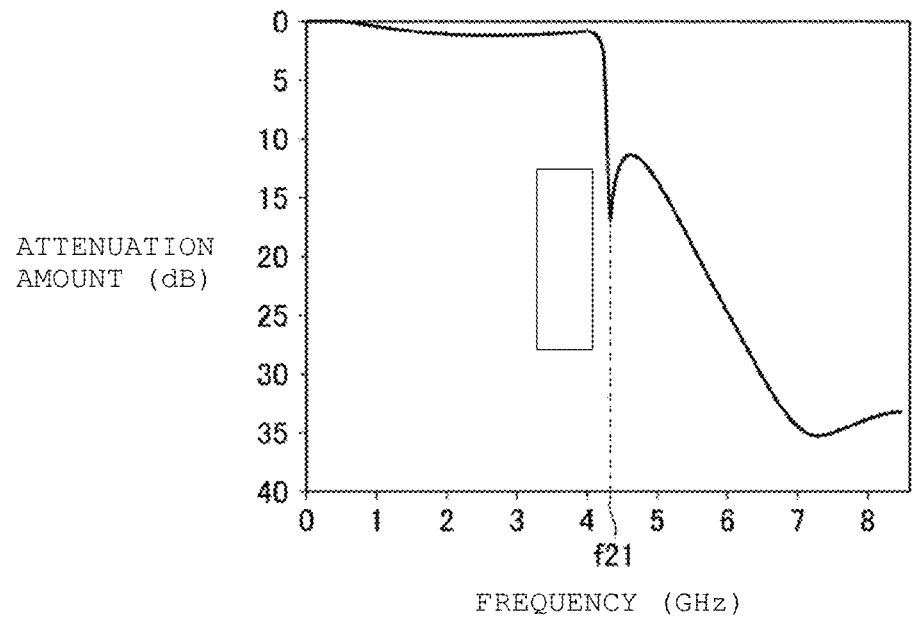
FIGS. 15A and 15B are diagram showing the bandpass characteristic of the diplexer of FIG. 10.
Figure 15B:
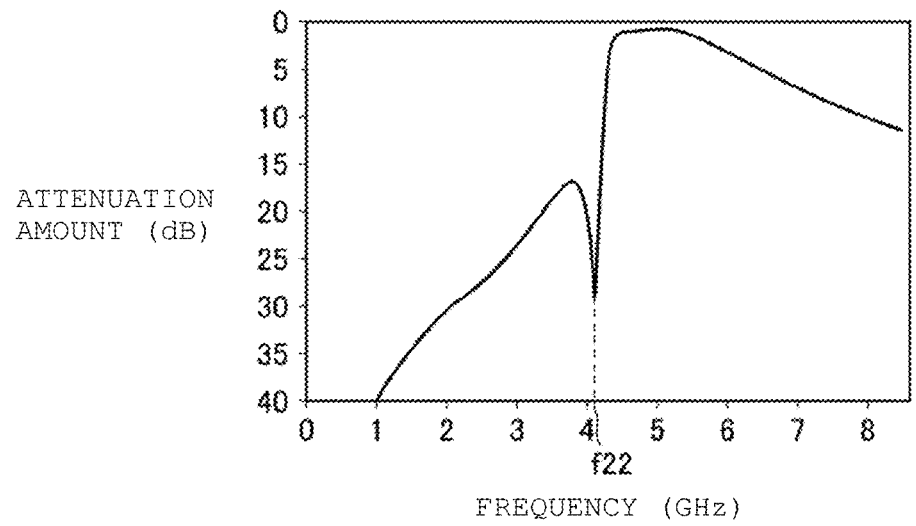

FIGS. 15A and 15B are diagrams showing the bandpass characteristic (frequency characteristic of insertion loss) of the diplexer 2 of FIG. 10. FIG. 15A shows the bandpass characteristic of the low-pass filter 2LB defining the low-pass side of the pass band of the diplexer 2, and FIG. 15B shows the bandpass characteristic of the high-pass filter 2HB defining the high-pass side of the pass band of the diplexer 2. Note that an insertion loss is an index defining the rate of signals transmitted to the other terminals of an electronic component among the signals input to a certain terminal of the electronic component. The larger the insertion loss, the larger the proportion of the signal input to the electronic component that is lost inside the electronic component.

As shown in FIG. 15A, in the bandpass characteristic of the diplexer 2 on the low frequency side, the insertion loss sharply decreases in the frequency band on the low frequency side from a frequency f21 where an attenuation pole is formed. The attenuation pole at the frequency f21 is an attenuation pole formed by the resonant element 1L. Due to the attenuation pole, a large gap is provided between the insertion loss on the low frequency side and the insertion loss on the high frequency side, and the insertion loss on the low frequency side becomes small. As a result, the operation of the low-pass filter 2LB that limits the frequency of passable signals to the frequency band on the low frequency side has been significantly improved.

As shown in FIG. 15B, in the bandpass characteristic of the diplexer 2 on the high frequency side, the insertion loss sharply decreases in the frequency band on the high frequency side from the frequency f22 where an attenuation pole is formed. The attenuation pole at frequency f22 is an attenuation pole formed by the resonant element 1H. Due to the attenuation pole, a large gap is provided between the insertion loss on the low frequency side and the insertion loss on the high frequency side, and the insertion loss on the high frequency side becomes small. As a result, the operation of the high-pass filter 2HB that limits the frequency of passable signals to the frequency band on the high frequency side has been improved.

In the second preferred embodiment, the case where the inductor is connected to the second input-output portion of the resonant element according to the first preferred embodiment has been described. The inductor may not be connected to the second input-output portion of the resonant element according to the first preferred embodiment as in the diplexer 2A according to a modification of the second preferred embodiment shown in FIG. 16.

Figure 16:
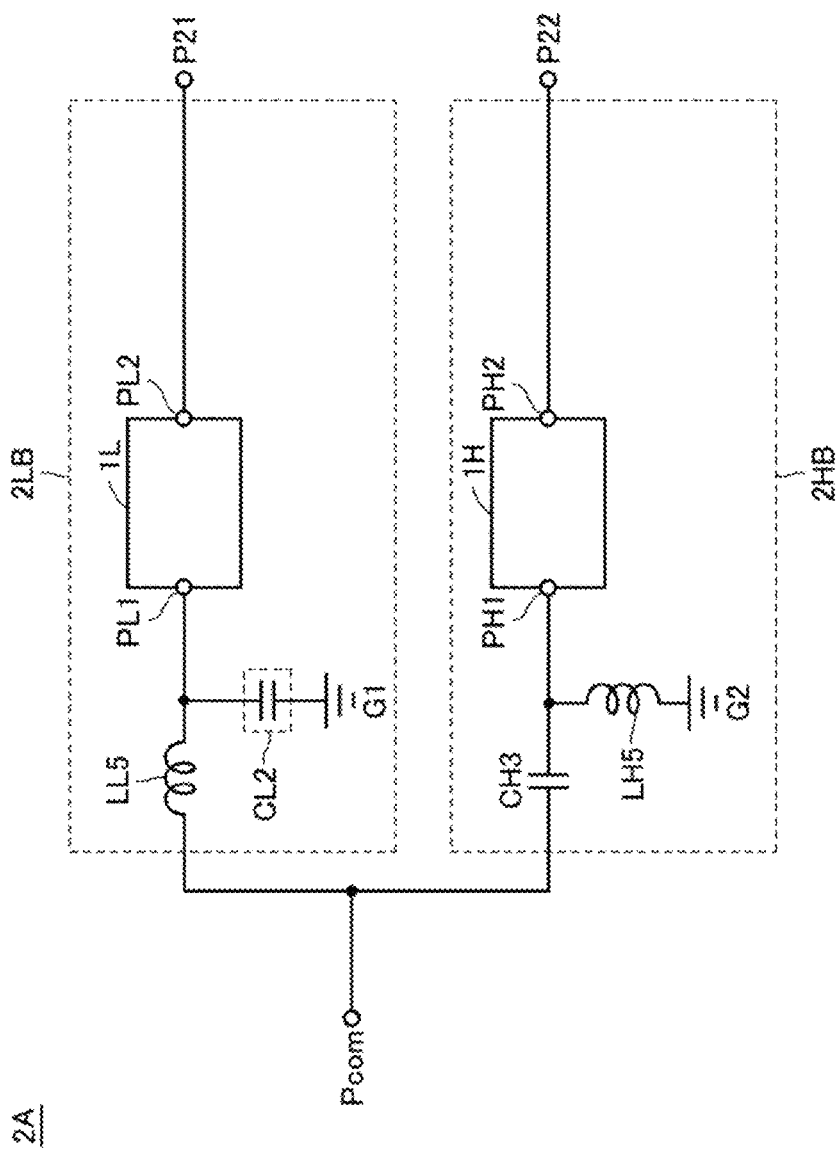
FIG. 16 is an equivalent circuit diagram of a diplexer according to a modification of the second preferred embodiment of the present invention.
Figure 17:
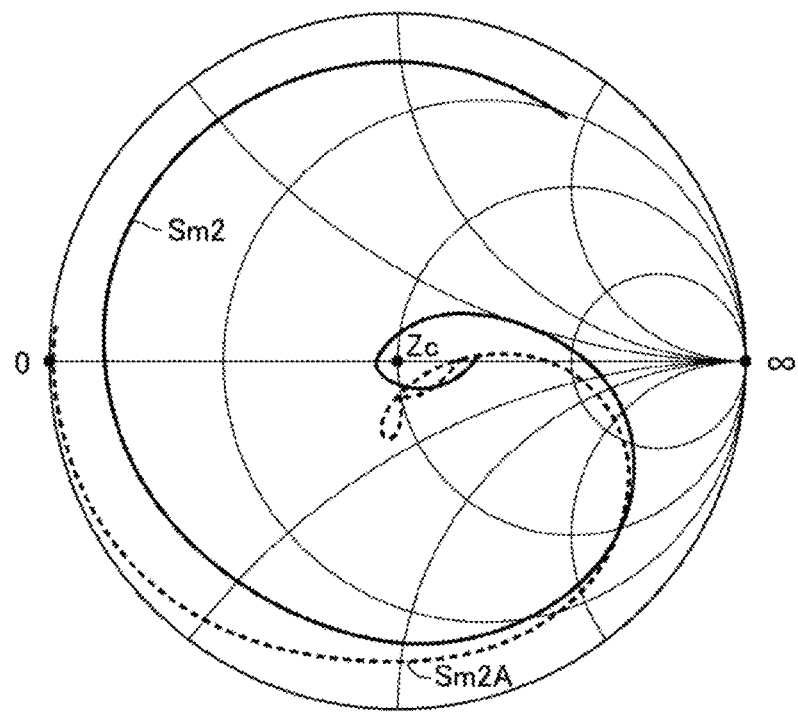
FIG. 17 is a Smith chart showing both the frequency characteristic of the impedance of the diplexer of FIG. 10 and the frequency characteristic of the impedance of the diplexer of FIG. 16.

FIG. 17 is a Smith chart showing the impedance frequency characteristic Sm2 of the diplexer 2 of FIG. 10 and also the impedance frequency characteristic Sm2A of the diplexer 2A of FIG. 16. In FIG. 16, the frequency ranges from about 0.5 GHz to about 8.5 GHz. Impedance Zc represents the characteristic impedance (for example, about 50Ω).

As shown in FIG. 16, the impedance of the diplexer 2 is matched to the characteristic impedance rather than the impedance of the diplexer 2A. This is because the impedance mismatch due to the stray capacitance in the diplexer 2A is eliminated by the inductor LL4 in the diplexer 2.

As described above, according to the diplexer according to the second preferred embodiment and the modification, filtering is able to be significantly improved.

Third Preferred Embodiment

Figure 18:
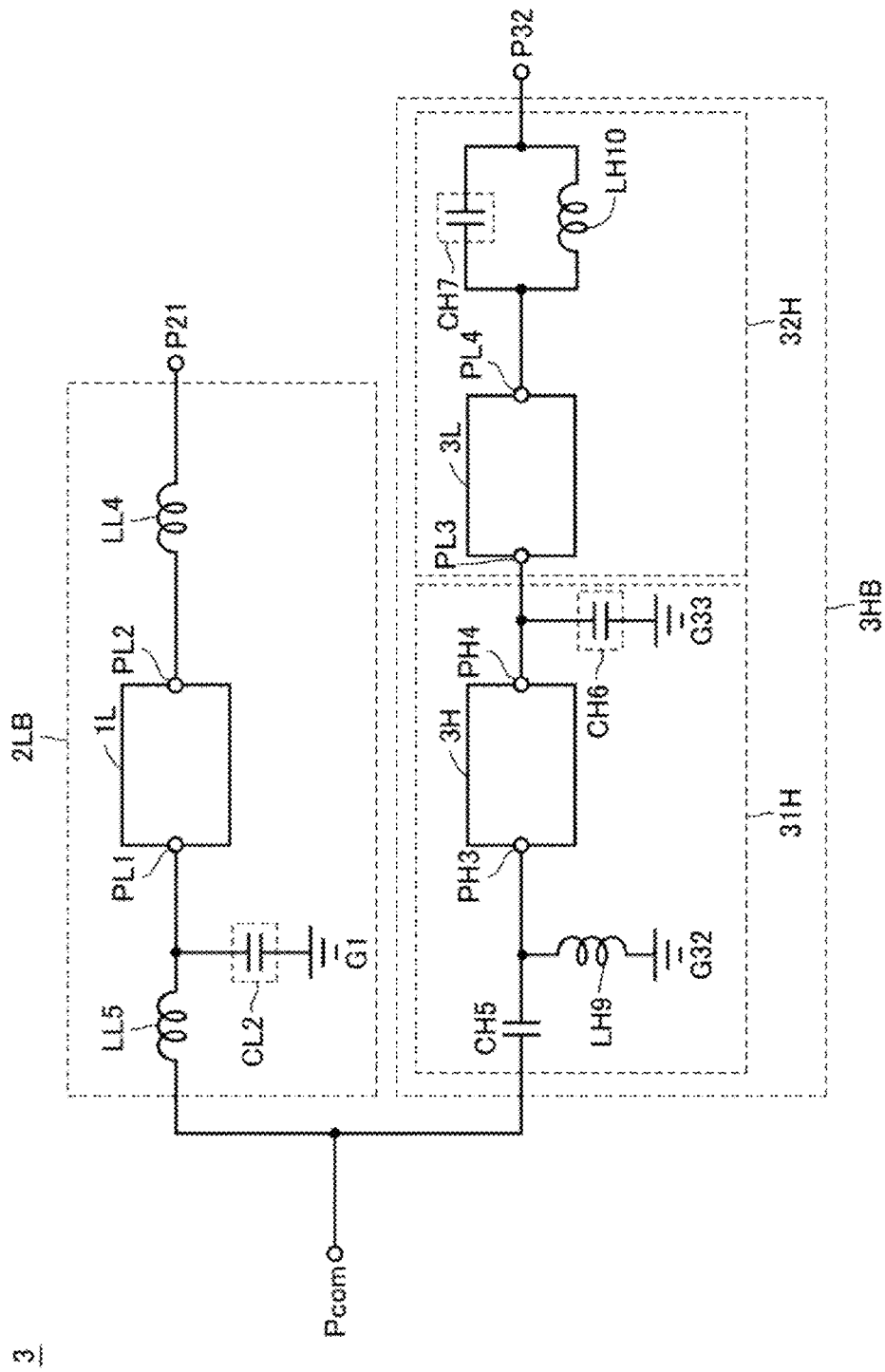
FIG. 18 is an equivalent circuit diagram of a diplexer according to a third preferred embodiment of the present invention.

FIG. 18 is an equivalent circuit diagram of a diplexer according to a third preferred embodiment of the present invention. According to the features of the diplexer 3, the high-pass filter 2HB and the input-output terminal P22 of the diplexer 2 shown in FIG. 10 are replaced with a bandpass filter 3HB and an input-output terminal P32 (second input-output terminal), respectively. Features other than those described above are the same or similar to the features of the first and second preferred embodiments. Therefore, the explanation thereof is not repeated.

The bandpass filter 3HB is connected between the common terminal Pcom and the input-output terminal P32. The bandpass filter 3HB includes filters 31H and 32H. The filter 31H includes a capacitor CH5, an inductor LH9, a capacitor CH6 (third capacitor), and a resonant element 3H (second resonant element). The resonant element 3H defines and functions as a high-pass filter. The filter 32H includes a resonant element 3L (third resonant element), a capacitor CH7, and an inductor LH10. The resonant element 3L defines and functions as a low-pass filter.

The capacitor CH5 is connected between the common terminal Pcom and an input-output portion PH3. The inductor LH9 is connected between a ground terminal G32 (ground point) and the connection point between the capacitor CH5 and the input-output portion PH3. An input-output portion PH4 is connected to the input-output portion PL3. The capacitor CH6 is connected between the input-output portion PH4 and a ground terminal G33 (ground point). A capacitor CH7 and an inductor LH10 are connected in parallel between an input-output portion PL4 and the input-output terminal P32.

Figure 19:
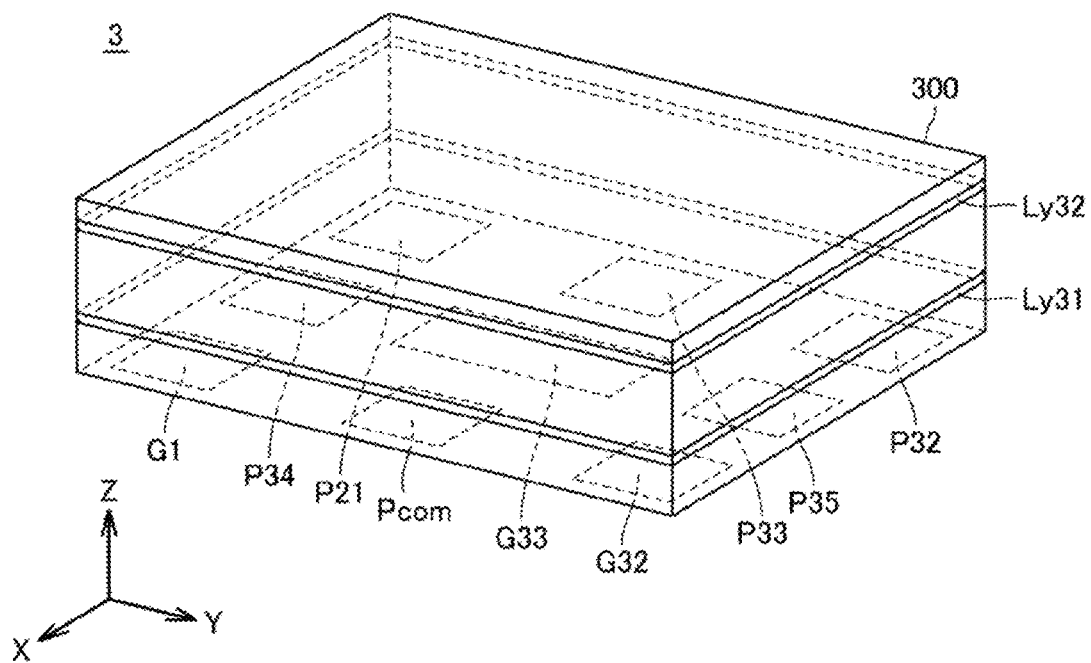
FIG. 19 is an external perspective view of the diplexer of FIG. 18.
Figure 20:
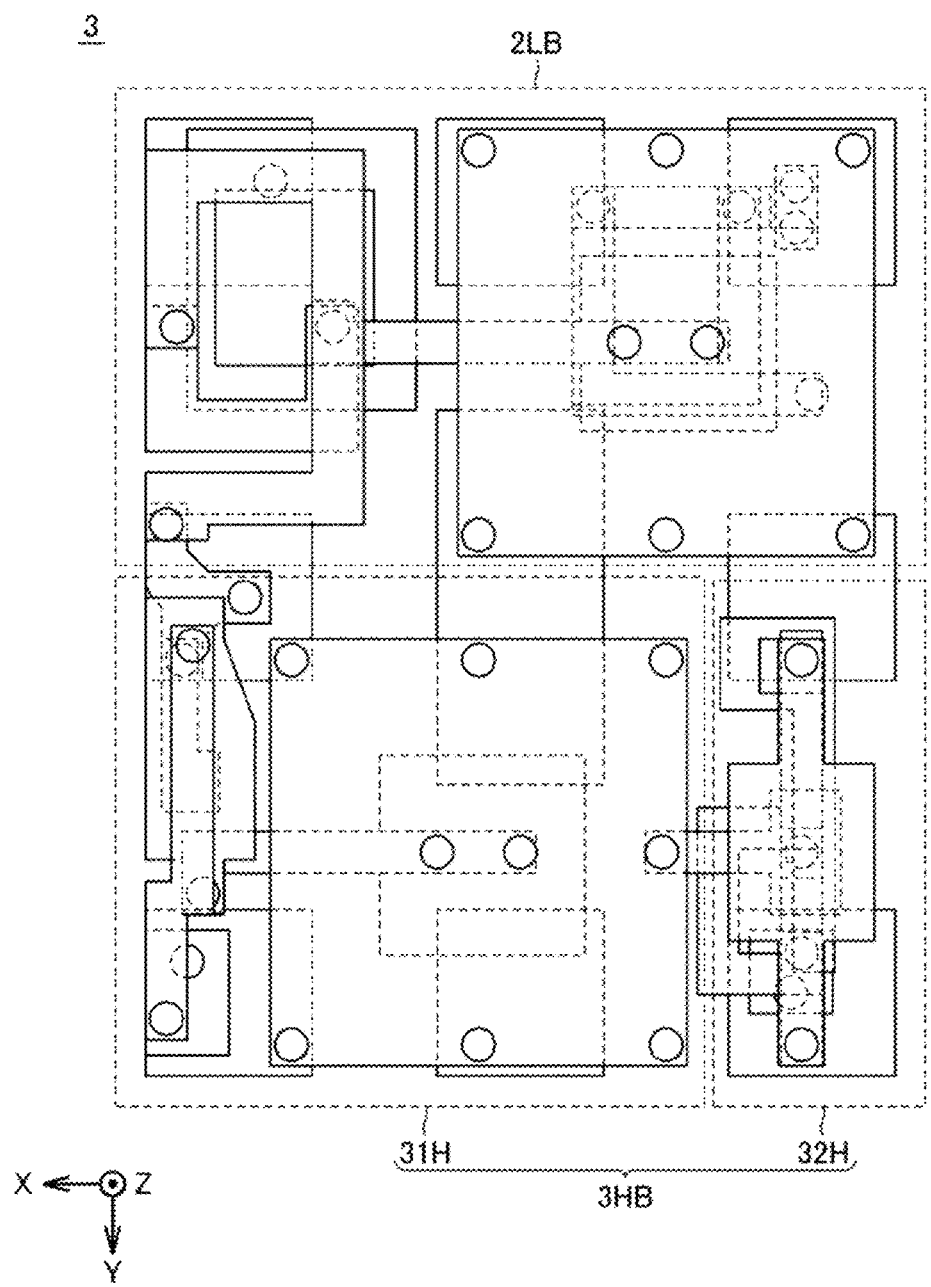
FIG. 20 is a plan view of a plurality of electrodes provided inside a laminate of FIG. 19 as viewed from the Z-axis direction.

FIG. 19 is an external perspective view of the diplexer 3 of FIG. 18. FIG. 20 is a plan view of a plurality of electrodes provided inside a laminate 300 of FIG. 19 as viewed from the Z-axis direction. As shown in FIGS. 19 and 20, in the diplexer 3, a plurality of electrodes defining an equivalent circuit shown in FIG. 18 are provided inside the laminate 300 (dielectric) defined by laminating a plurality of dielectric layers including dielectric layers Ly31 and Ly32 in the Z-axis direction. The dielectric constant of each of the dielectric layers Ly31 and Ly32 is larger than the dielectric constant of the dielectric layers other than the dielectric layers Ly31 and Ly32 in the plurality of dielectric layers.

With reference to FIG. 19, the common terminal Pcom, the input-output terminals P21 and P32, terminals P33 to P35, and the ground terminals G1, G32, and G33 are provided on the bottom surface of the diplexer 3. These terminals are, for example, land grid array (LGA) terminals in which plane electrodes are regularly arranged on the bottom surface. The ground terminal G33 is located in a central portion of the bottom surface of the diplexer 3. The width of the ground terminal G33 in the Y-axis direction is wider than that of other terminals. The bottom surface of the diplexer 3 is connected to a circuit board not shown.

Figure 21:
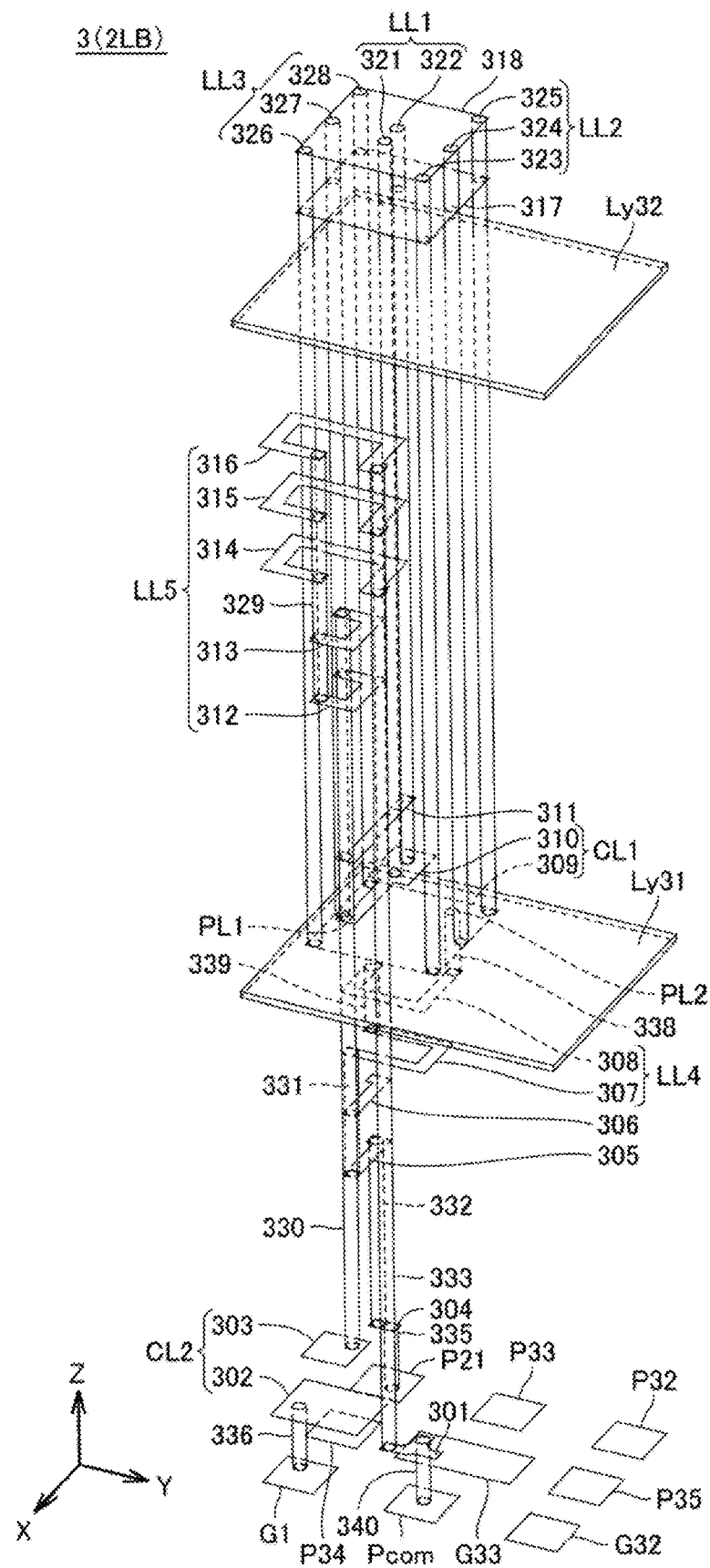
FIG. 21 is an exploded perspective view showing an example of a laminated structure of a plurality of electrodes defining the low-pass filter shown in FIG. 20.
Figure 22:
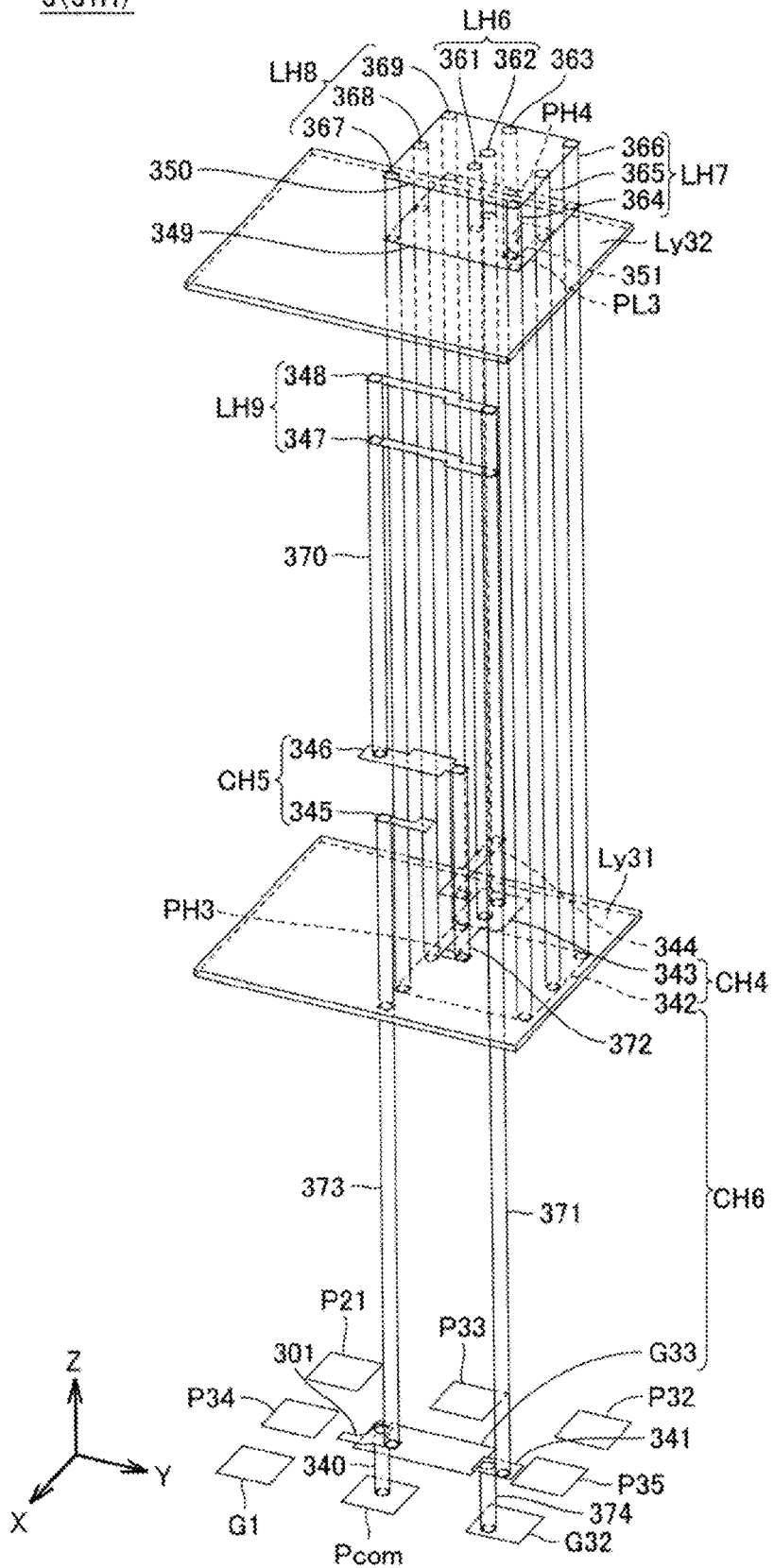
FIG. 22 is an exploded perspective view showing an example of a laminated structure of a plurality of electrodes defining a filter of the bandpass filter shown in FIG. 20.
Figure 23:
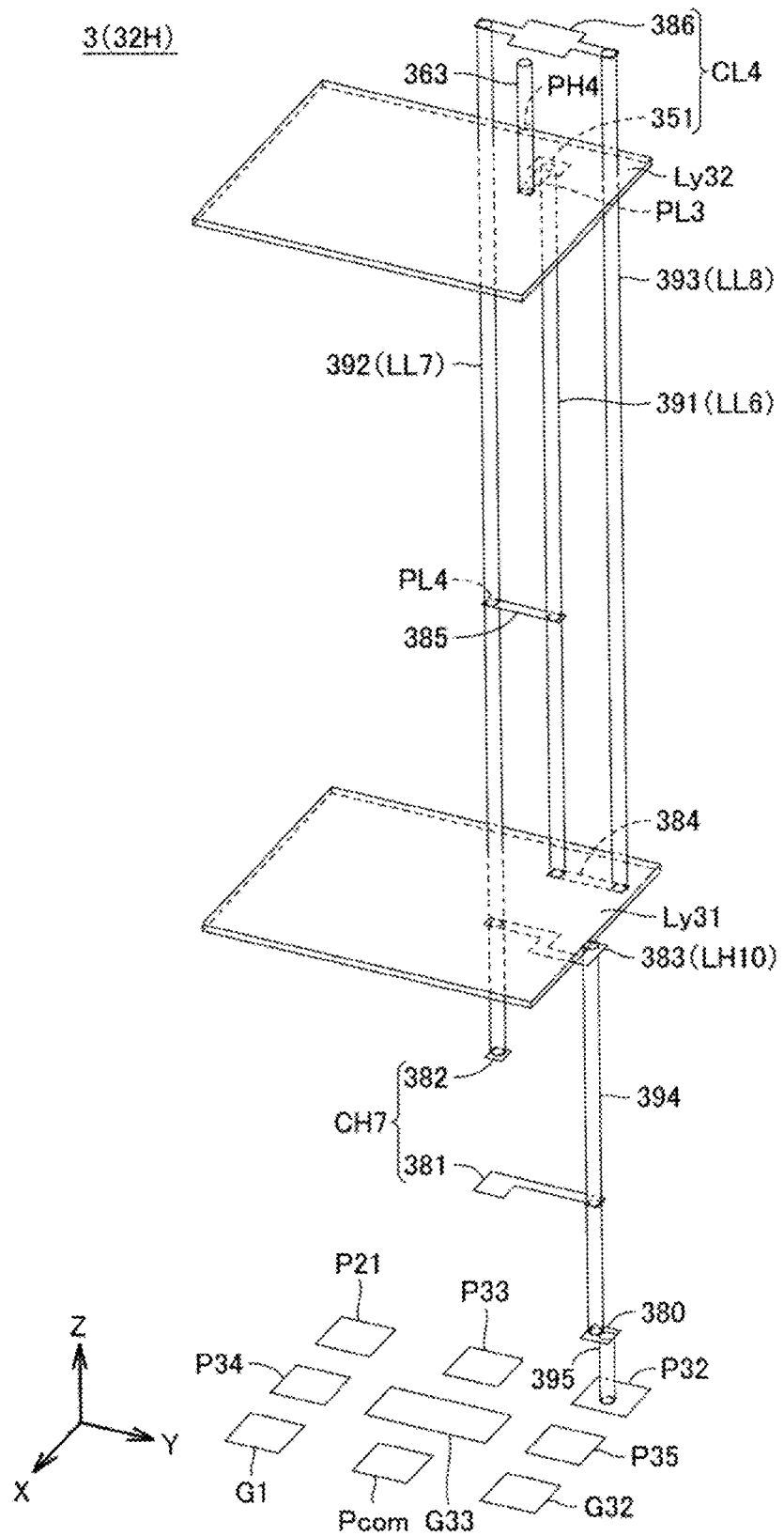
FIG. 23 is an exploded perspective view showing an example of a laminated structure of a plurality of electrodes defining the other filter of the bandpass filter shown in FIG. 20.

FIGS. 21 to 23 are exploded perspective views showing an example of the laminated structure of the diplexers 3 of FIGS. 19 and 20. The connection relationship between the plurality of electrodes defining the low-pass filter 2LB, the filter 31H, and the filter 32H of FIG. 18 will be described with reference to FIGS. 21 to 23, respectively. Further, in order to make it easier to see the connection relationship of the respective electrodes in the laminated structure, FIGS. 21 to 23 do not show dielectric layers other than the dielectric layers Ly31 and Ly32 among the plurality of dielectric layers defining the laminate 300.

FIG. 21 is an exploded perspective view showing an example of a laminated structure of a plurality of electrodes defining the low-pass filter 2LB shown in FIG. 20. As shown in FIG. 21, a line electrode 301 is connected to the common terminal Pcom by a via electrode 340. The line electrode 301 is connected to a line electrode 314 by a via electrode 333. The line electrode 314 is connected to a line electrode 315 by the via electrode 333. The line electrode 315 is connected to a line electrode 316 by the via electrode 333. The line electrode 316 is connected to the line electrode 315 by a via electrode 329. The line electrode 315 is connected to the line electrode 314 by the via electrode 329. The line electrodes 314 to 316 wind around a winding shaft (not shown) extending in the Z-axis direction. The line electrode 314 is connected to a line electrode 313 by the via electrode 329. The line electrode 313 is connected to a line electrode 312 by the via electrode 329. The line electrode 313 is connected to the line electrode 312 by a via electrode 330. The line electrode 312 is connected to a line electrode 311 by the via electrode 330. The line electrodes 312 and 313 wind around a winding shaft (not shown) extending in the Z-axis direction. The line electrodes 312 to 316 and the via electrodes 329, 330 and 333 define the inductor LL5.

The line electrode 311 is connected to a plane electrode 310 (second plane electrode) by the via electrode 330. The input-output portion PL1 is provided at the connection portion between the via electrode 330 and the plane electrode 310 (protrusion of the plane electrode 310). The plane electrode 310 is connected to a plane electrode 303 by the via electrode 330. A plane electrode 302 is connected to the ground terminal G1 by a via electrode 336. The plane electrodes 302 and 303 define the capacitor CL2.

The plane electrode 310 is connected to the line electrode 311 by a via electrode 321 (first via electrode) and a via electrode 322 (first via electrode). The line electrode 311 is connected to a plane electrode 317 (first plane electrode) by the via electrodes 321 and 322. The plane electrode 317 is connected to a plane electrode 318 (first plane electrode) by the via electrodes 321 and 322. The via electrodes 321 and 322 define the inductor LL1.

The plane electrode 318 is connected to the plane electrode 317 by a via electrode 323 (second via electrode), a via electrode 324 (second via electrode), and a via electrode 325 (second via electrode). The plane electrode 318 is connected to the plane electrode 317 by a via electrode 326 (third via electrode), a via electrode 327 (third via electrode), and a via electrode 328 (third via electrode). The plane electrode 317 is connected to a plane electrode 309 (third plane electrode) by the via electrodes 323 to 328.

The via electrodes 323 to 325 define the inductor LL2. The via electrodes 326 to 328 define the inductor LL3. The plane electrodes 309 and 310 define the capacitor CL1. A dielectric layer Ly31 is located between the plane electrodes 309 and 310. The capacitance of the capacitor CL1 is adjusted to be a predetermined value by the dielectric layer Ly31. Ly32 is located between the plane electrodes 310 and 317. The plane electrode 310 is located between the dielectric layers Ly31 and Ly32.

The plane electrode 309 is connected to a line electrode 308 by a via electrode 338. The input-output portion PL2 is provided at the connection portion between the plane electrode 309 and the via electrode 338. The line electrode 308 is connected to a line electrode 307 by a via electrode 339. The line electrodes 307 and 308 wind around a winding shaft (not shown) extending in the Z-axis direction. The line electrodes 307 and 308 and the via electrodes 339 define the inductor LL4.

The line electrode 307 is connected to ae line electrode 306 by a via electrode 331. The line electrode 306 is connected to a line electrode 305 by the via electrode 331. The line electrode 305 is connected to a line electrode 304 by a via electrode 332. The line electrode 304 is connected to the input-output terminal P21 by a via electrode 335.

FIG. 22 is an exploded perspective view showing an example of a laminated structure of a plurality of electrodes defining the filter 31H of the bandpass filter 3HB shown in FIG. 20. As shown in FIG. 22, the line electrode 301 is connected to a plane electrode 345 by a via electrode 373. A plane electrode 346 is connected to a line electrode 347 by a via electrode 370. The plane electrode 346 is connected to a line electrode 344 by a via electrode 372. The plane electrodes 345 and 346 define the capacitor CH5.

The line electrode 347 is connected to a line electrode 348 by the via electrode 370. The line electrode 348 is connected to the line electrode 347 by a via electrode 371. The line electrode 347 is connected to a line electrode 341 by the via electrode 371. The line electrode 341 is connected to the ground terminal G32 by a via electrode 374. The line electrodes 347 and 348 define the inductor LH9.

The line electrode 344 is connected to the plane electrode 343 (second plane electrode) by the via electrode 372. The input-output portion PH3 is provided at the connection portion between the via electrode 372 and the plane electrode 343 (protrusion of the plane electrode 343). The plane electrode 343 is connected to the line electrode 344 by a via electrode 361 (first via electrode) and a via electrode 362 (first via electrode). The line electrode 344 is connected to a plane electrode 349 (first plane electrode) by the via electrodes 361 and 362. The plane electrode 349 is connected to a plane electrode 350 (first plane electrode) by the via electrodes 361 and 362. The via electrodes 361 and 362 define the inductor LH6.

The plane electrode 350 is connected to the plane electrode 349 by a via electrode 364 (second via electrode), a via electrode 365 (second via electrode), and a via electrode 366 (second via electrode). The plane electrode 350 is connected to the plane electrode 349 by a via electrode 367 (third via electrode), a via electrode 368 (third via electrode), and a via electrode 369 (third via electrode). The plane electrode 350 is connected to the plane electrode 349 by a via electrode 363. The plane electrode 349 is connected to the plane electrode 351 (second plane electrode) by a via electrode 363. The input-output portion PH4 is provided at the connection portion between the via electrode 363 and the plane electrode 349. The input-output portion PL3 is provided at the connection portion between the via electrode 363 and the plane electrode 351 (protrusion of the plane electrode 351). The plane electrode 349 is connected to the plane electrode 342 (third plane electrode) by the via electrodes 364 to 369.

The via electrodes 364 to 366 define the inductor LH7. The via electrodes 367 to 369 define the inductor LH8. The plane electrodes 342 and 343 define the capacitor CH4. The plane electrode 342 and the ground terminal G33 define the capacitor CH6. The dielectric layer Ly31 is located between the plane electrodes 342 and 343. The capacitance of the capacitor CH4 is adjusted to be a predetermined value by the dielectric layer Ly31. The Ly32 is located between the plane electrodes 349 and 351. The plane electrode 343 is located between the dielectric layers Ly31 and Ly32.

FIG. 23 is an exploded perspective view showing an example of a laminated structure of a plurality of electrodes defining the filter 32H of the bandpass filter 3HB shown in FIG. 20. As shown in FIG. 23, the plane electrode 351 is connected to a plane electrode 385 (first plane electrode) by a via electrode 391 (first via electrode). The plane electrode 385 is connected to a plane electrode 384 (first plane electrode) by the via electrode 391. The via electrode 391 defines the inductor LL6. A plane electrode 386 (third plane electrode) is connected to the plane electrode 385 by a via electrode 392 (second via electrode). The via electrode 392 defines the inductor LL7. The input-output portion PL4 is provided at the connection portion between the via electrode 392 and the plane electrode 385. The plane electrode 386 is connected to the plane electrode 384 by a via electrode 393 (third via electrode). The via electrode 393 defines an inductor LL8.

The plane electrodes 351 and 386 define the capacitor CL4. The dielectric layer Ly32 is located between the plane electrodes 351 and 386. The capacitance of the capacitor CL4 is adjusted to be a predetermined value by the dielectric layer Ly32. The dielectric layer Ly31 is located between the plane electrodes 384 and 385. The plane electrode 351 is located between the dielectric layers Ly31 and Ly32.

The plane electrode 385 is connected to a line electrode 383 by the via electrode 392. The line electrode 383 winds around a winding shaft (not shown) extending in the Z-axis direction. The line electrode 383 defines the inductor LH10. The line electrode 383 is connected to the plane electrode 382 by the via electrode 392. The line electrode 383 is connected to a plane electrode 381 by a via electrode 394. The plane electrodes 381 and 382 define the capacitor CH7. The plane electrode 381 is connected to the line electrode 380 by the via electrode 394. The line electrode 380 is connected to the input-output terminal P32 by a via electrode 395.

Usually, a laminate is provided by firing a plurality of laminated dielectrics. The shrinkage rate of each of the plurality of dielectric layers at the time of firing differs depending on the magnitude of the dielectric constant of each dielectric layer. When the dielectric layers having a relatively large dielectric constant are provided unevenly on the upper surface side or the bottom surface side of the laminate, the difference between the shrinkage rate of the dielectric on the upper surface side of the laminate and the shrinkage rate of the dielectric on the bottom surface side is large. As a result, the laminate after firing may be warped. When the laminate is warped, the strength of the diplexer may be reduced and the characteristics of the diplexer may deviate from the predetermined characteristics.

In the laminate 300, the capacitor CH4 of the resonant element 3H is provided on the bottom surface side of the laminate 300, and the capacitor CL4 of the resonant element 3L is provided on the upper surface side of the laminate 300. Therefore, the dielectric layers Ly31 and Ly32 having a larger dielectric constant than that of the other dielectric layers are provided on the bottom surface side and the top surface side of the laminate 300, respectively. Since the difference between the shrinkage rate of the dielectric on the bottom surface side of the laminate 300 and the shrinkage rate of the dielectric on the top surface side is reduced, the warp of the laminate 300 is reduced or prevented. As a result, a decrease in the strength of the diplexer 3 is able to be reduced or prevented, and the characteristics of the diplexer are prevented from deviating from the predetermined characteristics.

Figure 24:
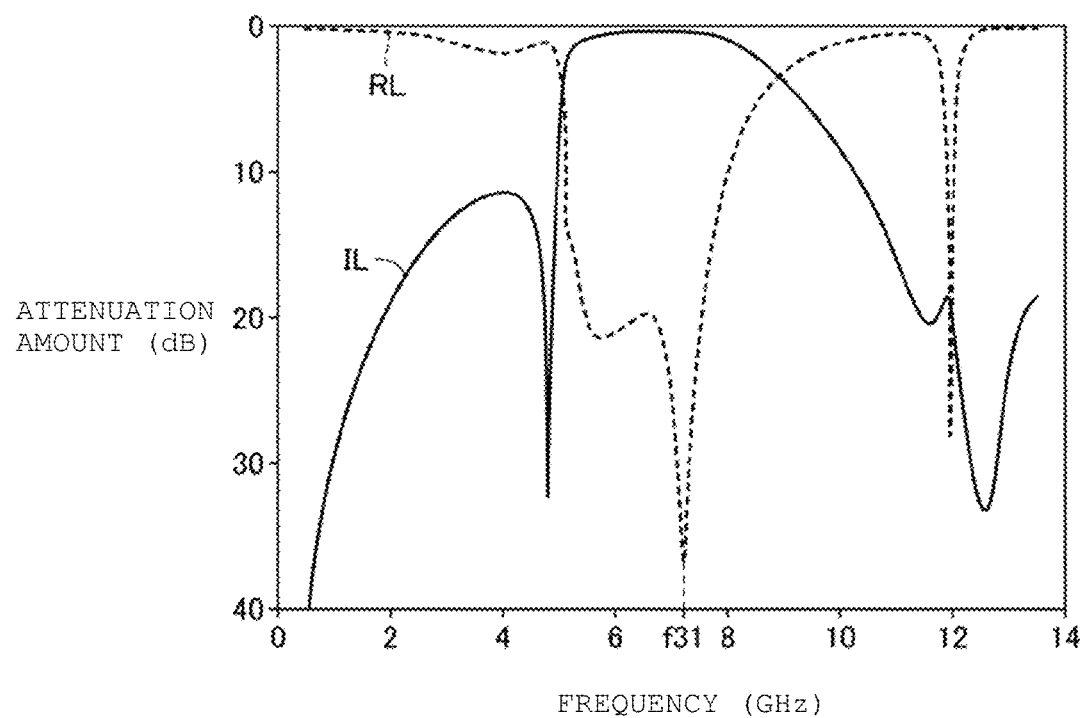
FIG. 24 is a diagram showing the bandpass characteristic and the reflection characteristic of the bandpass filter of FIG. 18.

FIG. 24 is a diagram showing the bandpass characteristic IL and the reflection characteristic RL (frequency characteristic of reflection loss) of the bandpass filter 3HB of FIG. 18. As shown in FIG. 24, the reflection characteristic RL is minimized at a frequency f31. As a result, the bandpass characteristic IL is able to maintain a relatively small amount of attenuation up to the frequency f31. The sharp decrease in the reflection loss near the frequency f31 is due to the frequency characteristic of the impedance of the circuit including the capacitor CH6 and the resonant element 3L. Since the pass band of the resonant element 3H is widened by the capacitor CH6 and the resonant element 3L, the pass band of the bandpass filter 3HB is able to be widened.

As described above, according to the diplexer according to the third preferred embodiment, filtering is able to be improved. In addition, a decrease in the strength of the diplexer is able to be reduced or prevented, and the characteristics of the diplexer are prevented from deviating from the predetermined characteristics. Further, the pass band of the diplexer is able to be widened.

The preferred embodiments described herein may be appropriately combined and implemented within a consistent range. The preferred embodiments disclosed herein are provided as examples in all respects and not restrictive. The scope of the present invention is shown by the claims rather than the above description, and it is intended to include all modifications within the meaning and scope equivalent to the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resonant element in which a plurality of electrodes are provided inside a dielectric, the resonant element comprising:
   at least one first plane electrode provided inside of the dielectric;
   a second plane electrode facing the at least one first plane electrode in a normal direction of the at least one first plane electrode;
   a first via electrode connecting the at least one first plane electrode and the second plane electrode to define a first inductor;
   a third plane electrode defining a first capacitor together with the second plane electrode;
   a second inductor connecting the at least one first plane electrode and the third plane electrode; and
   a third inductor connecting the at least one first plane electrode and the third plane electrode; wherein
   the second inductor includes at least one second via electrode connecting the at least one first plane electrode and the third plane electrode;
   the at least one second via electrode is directly connected to the third plane electrode;
   the third inductor includes at least one third via electrode connecting the at least one first plane electrode and the third plane electrode;
   the at least one third via electrode is directly connected to the third plane electrode;
   each of the at least one second via electrode and the at least one third via electrode is a columnar conductor extending in an extending direction of the first via electrode;
   a first distance between the first inductor and the second inductor is shorter than a second distance between the second inductor and the third inductor; and
   a third distance between the first inductor and the third inductor is shorter than the second distance.

2. A filter comprising the resonant element according to claim 1.

3. The resonant element according to claim 1, wherein
   a first input-output portion is provided on the second plane electrode;
   a second input-output portion is provided on the at least one first plane electrode or the third plane electrode; and
   each of the first input-output portion and the second input-output portion is configured to input an input signal from an outside of the resonant element and to output an output signal to the outside of the resonant element.

4. The resonant element according to claim 3, further comprising a fourth inductor including one end connected to the second input-output portion.

5. The resonant element according to claim 4, wherein
   the resonant element defines a low-pass filter; and
   each of the first input-output portion and another end of the fourth inductor defines an input-output terminal of the low-pass filter.

6. The resonant element according to claim 4, wherein
   the resonant element defines a high-pass filter;
   each of the first input-output portion and the second input-output portion defines an input-output terminal of the high-pass filter; and
   the other end of the fourth inductor is connected to a ground point.

7. A diplexer comprising:
   a common terminal;
   a first input-output terminal;
   a second input-output terminal;
   a low-pass filter connected between the common terminal and the first input-output terminal; and
   a high-pass filter connected between the common terminal and the second input-output terminal; wherein
   the low-pass filter includes a first resonant including:
      at least one first plane electrode;
      a second plane electrode facing the at least one first plane electrode in a normal direction of the at least one first plane electrode;
      a first via electrode connecting the at least one first plane electrode and the second plane electrode to define a first inductor;
      a third plane electrode defining a first capacitor together with the second plane electrode;
      a second inductor connecting the at least one first plane electrode and the third plane electrode;
      a third inductor connecting the at least one first plane electrode and the third plane electrode; and
      a fourth inductor; wherein
      the second inductor includes at least one second via electrode connecting the at least one first plane electrode and the third plane electrode;
      the third inductor includes at least one third via electrode connecting the at least one first plane electrode and the third plane electrode;
      each of the at least one second via electrode and the at least one third via electrode is a columnar conductor extending in an extending direction of the first via electrode;
      a first input-output portion is provided on the second plane electrode;
      a second input-output portion is provided on the at least one first plane electrode or the third plane electrode;
      each of the first input-output portion and the second input-output portion is configured to input an input signal from an outside of the resonant element and to output an output signal to the outside of the resonant element;
      the fourth inductor includes one end connected to the second input-output portion; and
      each of the first input-output portion and another end of the fourth inductor defines an input-output terminal of the low-pass filter;
   the first input-output portion of the first resonant element is electrically connected to the common terminal;
   a fourth inductor of the first resonant element is connected between the second input-output portion of the first resonant element and the first input-output terminal;
   the high-pass filter includes:
      a second resonant element that is the resonant element according to claim 6; and
      a second capacitor connected in parallel with a fourth inductor of the second resonant element between the second input-output portion of the second resonant element and the ground point;

the first input-output portion of the second resonant element is electrically connected to the common terminal; and the second input-output portion of the second resonant element is electrically connected to the second input-output terminal.

8. The resonant element according to claim 4, wherein the fourth inductor is defined by a line electrode.

9. The resonant element according to claim 3, wherein the at least one second via electrode includes a plurality of second via electrodes;

the at least one third via electrode includes a plurality of third via electrodes;

the plurality of second via electrodes are provided along a first direction;

the plurality of third via electrodes are provided along the first direction, separated from the plurality of second via electrodes in a second direction orthogonal or substantially orthogonal to the first direction;

the second plane electrode is between the plurality of second via electrodes and the plurality of third via electrodes;

the second plane electrode includes a protrusion that protrudes in the first direction and defines the first input-output portion; and when the at least one first plane electrode is viewed from the normal direction in a plan view, at least a portion of the protrusion does not overlap with the at least one first plane electrode and the third plane electrode.

10. The resonant element according to claim 3, wherein the at least one first plane electrode includes one first plane electrode.

11. The resonant element according to claim 3, wherein the at least one first plane electrode includes two first plane electrodes connected to each other;

the at least one second via electrode connects one first plane electrode of the two first plane electrodes and the third plane electrode; and the at least one third via electrode connects another first plane electrode of the two first plane electrodes and the third plane electrode.

12. A filter in which a plurality of dielectric layers including a first dielectric layer and a second dielectric layer are laminated, the filter comprising:

a second resonant element and a third resonant element that are resonant elements according to claim 3; wherein a second input-output portion of the second resonant element is connected to a first input-output portion of the third resonant element;

a dielectric constant of each of the first dielectric layer and the second dielectric layer is larger than dielectric constant of each of the plurality of dielectric layers other than the first dielectric layer and the second dielectric layer;

the first dielectric layer is between a second plane electrode of the second resonant element and a third plane electrode of the second resonant element;

the second dielectric layer is between a second plane electrode of the third resonant element and a third plane electrode of the third resonant element; and the second plane electrode of a second resonant element and the second plane electrode of the third resonant element are between the first dielectric layer and the second dielectric layer.

13. A diplexer comprising:

a common terminal;

a first input-output terminal;

a second input-output terminal;

a low-pass filter connected between the common terminal and the first input-output terminal; and a bandpass filter connected between the common terminal and the second input-output terminal, the bandpass filter being the filter according to claim 12; wherein the low-pass filter includes a first resonant element including:

at least one first plane electrode;

a second plane electrode facing the at least one first plane electrode in a normal direction of the at least one first plane electrode;

a first via electrode connecting the at least one first plane electrode and the second plane electrode to define a first inductor;

a third plane electrode defining a first capacitor together with the second plane electrode;

a second inductor connecting the at least one first plane electrode and the third plane electrode;

a third inductor connecting the at least one first plane electrode and the third plane electrode; and a fourth inductor; wherein the second inductor includes at least one second via electrode connecting the at least one first plane electrode and the third plane electrode;

the third inductor includes at least one third via electrode connecting the at least one first plane electrode and the third plane electrode;

each of the at least one second via electrode and the at least one third via electrode is a columnar conductor extending in an extending direction of the first via electrode;

a first input-output portion is provided on the second plane electrode;

a second input-output portion is provided on the at least one first plane electrode or the third plane electrode;

each of the first input-output portion and the second input-output portion is configured to input an input signal from an outside of the resonant element and to output an output signal to the outside of the resonant element;

the fourth inductor includes one end connected to the second input-output portion; and each of the first input-output portion and another end of the fourth inductor defines an input-output terminal of the low-pass filter;

a first input-output portion of the first resonant element is electrically connected to the common terminal;

a fourth inductor of the first resonant element is connected between a second input-output portion of the first resonant element and the first input-output terminal;

the bandpass filter includes:

a third capacitor connected between the second input-output portion of the second resonant element and the ground point;

a first input-output portion of the second resonant element is electrically connected to the common terminal;

a second input-output portion of the third resonant element is electrically connected to the second input-output terminal; and the first dielectric layer is between a second plane electrode of the first resonant element and a third plane electrode of the first resonant element.

14. The resonant element according to claim 1, wherein the second via electrode is provided along a first side of the at least one first plane electrode parallel or substantially parallel to a first direction.

15. The resonant element according to claim 14, wherein the third via electrode is provided along a second side of the at least one first plane electrode, which is opposite to the first side, parallel or substantially parallel to the first direction.

16. The resonant element according to claim 1, further comprising at least one fourth via electrode that extends from the third plane electrode in a direction that is opposite to a side of the third plane electrode on which the second plane electrode is provided.

17. The resonant element according to claim 16, wherein a second input-output portion is provided at a connecting portion between the second plane electrode and the fourth via electrode.

* * * * *